(12) United States Patent
Kim et al.

(10) Patent No.: US 12,153,752 B2
(45) Date of Patent: Nov. 26, 2024

(54) TOUCH DISPLAY DEVICE AND DISPLAY PANEL

(71) Applicant: LG Display Co., Ltd., Seoul (KR)

(72) Inventors: Jinseong Kim, Gyeonggi-do (KR); JuHan Kim, Gyeonggi-do (KR); Haewon Lee, Seoul (KR); CheolSe Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/454,604

(22) Filed: Aug. 23, 2023

(65) Prior Publication Data

US 2024/0211062 A1 Jun. 27, 2024

(30) Foreign Application Priority Data

Dec. 26, 2022 (KR) .......................... 10-2022-0184808

(51) Int. Cl.
| | |
|---|---|
| *G06F 3/041* | (2006.01) |
| *G06F 3/044* | (2006.01) |
| *H10K 59/12* | (2023.01) |
| *H10K 59/122* | (2023.01) |
| *H10K 59/124* | (2023.01) |
| *H10K 59/40* | (2023.01) |

(52) U.S. Cl.
CPC .......... *G06F 3/0412* (2013.01); *G06F 3/0416* (2013.01); *G06F 3/0443* (2019.05); *H10K 59/1201* (2023.02); *H10K 59/122* (2023.02); *H10K 59/124* (2023.02); *H10K 59/40* (2023.02)

(58) Field of Classification Search
CPC ..... G06F 3/0412; G06F 3/0443; G06F 3/0416
See application file for complete search history.

(56) References Cited

U.S. PATENT DOCUMENTS

2022/0066588 A1* 3/2022 Kang .................. G06F 3/04164
2022/0206618 A1* 6/2022 Lee ....................... H10K 59/122

* cited by examiner

*Primary Examiner* — Dennis P Joseph
(74) *Attorney, Agent, or Firm* — Seed IP Law Group LLP

(57) ABSTRACT

The present disclosure provide a display device and a display panel, the display panel including: a transistor disposed over a substrate; a first planarization layer and a second planarization layer disposed over the transistor; an anode electrode disposed in a light emitting area on the second planarization layer and electrically connected to the transistor through an anode contact hole; a touch buffer layer disposed to cover the anode electrode; a touch electrode including an overlap area overlapping a portion of the anode electrode in a non-light emitting area on the touch buffer layer; a touch line disposed under the touch electrode and electrically connected to the touch electrode through a touch contact hole; a bank covering the touch electrode and including an opening in which the light emitting area is placed; and an emission layer and a cathode electrode sequentially disposed on the anode electrode.

19 Claims, 19 Drawing Sheets

(a)

(b)

(a)

(b)

(a)

(b)

(a)

(b)

(a)

(b)

(a)

(b)

(a)

(b)

(a)

(b)

(a)

(b)

(a)

TOUCH DISPLAY DEVICE AND DISPLAY PANEL

CROSS-REFERENCE TO RELATED APPLICATION

This application claims the priority benefit of Republic of Korea Patent Application No. 10-2022-0184808, filed Dec. 26, 2022, in the Korean Intellectual Property Office, which is incorporated herein by reference in its entirety.

BACKGROUND

Technical Field

The present disclosure relates to electronic devices, and more specifically, to a touch display device and a display panel that are capable of improving touch performance.

Description of the Related Art

With development of multimedia technology and widespread applications of multimedia, flat panel display devices have become increasingly important in today's society. To satisfy needs for such display devices, various types of flat panel display devices, such as a liquid crystal display device, an organic light emitting display device, a plasma display device, a quantum dot display device, and the like have been developed and provided.

Recently, a touch panel has been increasingly combined to, or integrated in, a display device in order for users to easily input information or a command to the display device in an intuitive and convenient manner. Such a touch display device is configured to produce information or perform calculations corresponding to a touch input by detecting the location (or coordinates) of the touch based on a change in an electrical property such as resistance or capacitance at a corresponding touch point touched by a conductive object, such as a finger, a stylus pen, or the like.

Such a touch display device is increasingly employed to provide user interfaces for electronic devices or telecommunication devices, such as portable terminals, office equipment, mobile devices, and the like.

However, combining a separate touch panel with a touch display device can lead the display device to become thick. This implementation can be therefore problematic for providing a thin display device, and have further disadvantages of reducing transmission efficiency of light while passing through the stacked touch panel, and increasing production costs. To address these issues, recently, an advanced in-cell touch (AIT) type of display device in which a touch electrode is integrated inside of a pixel area of a display panel has been proposed.

BRIEF SUMMARY

The inventors have realized that an in-cell touch type of display device may cause a decrease in an area of a touch electrode due to a distance between the touch electrodes and an adjacent metal electrode in the process of forming touch electrodes for touch sensing in a display panel, and thereby, touch performance can be reduced. They inventors describe herein solutions to these problems.

To address these issues. the inventors of the present disclosure have invented a touch display device and a display panel capable of increasing areas of touch electrodes and improving touch performance.

One or more embodiments of the present disclosure may provide a touch display device and a display panel that include a structure in which a portion of a touch electrode overlaps a portion of an anode electrode while the touch electrode is located over or under the anode electrode, and thereby, are capable of increasing the area of the touch electrode and improving touch performance.

One or more embodiments of the present disclosure may provide a touch display device and a display panel that include a structure in which a touch electrode and a touch line are interconnected by a touch jumping line disposed in the same layer as an anode electrode, and thereby, are capable of simplifying a manufacturing process and improving touch performance.

One or more embodiments of the present disclosure may provide a touch display device and a display panel that include a structure in which spacers configured to oppose each other are formed over the touch electrode, and thereby, are capable of increasing a path of forming touch capacitance, and improving touch performance.

According to aspects of the present disclosure, a display panel can be provided that includes: a transistor disposed over a substrate; a first planarization layer and a second planarization layer disposed over the transistor; an anode electrode disposed in a light emitting area on the second planarization layer and electrically connected to the transistor through an anode contact hole; a touch buffer layer disposed to cover the anode electrode; a touch electrode including an overlap area overlapping a portion of the anode electrode in a non-light emitting area on the touch buffer layer; a touch line disposed under the touch electrode and electrically connected to the touch electrode through a touch contact hole; a bank covering the touch electrode and including an opening in which the light emitting area is placed; and an emission layer and a cathode electrode sequentially disposed on the anode electrode.

According to aspects of the present disclosure, a touch display device can be provided that includes: a display panel including a transistor disposed over a substrate, a first planarization layer and a second planarization layer disposed over the transistor, an anode electrode disposed in a light emitting area on the second planarization layer and electrically connected to the transistor through an anode contact hole, a touch buffer layer disposed to cover the anode electrode, a touch electrode including an overlap area overlapping a portion of the anode electrode in a non-light emitting area on the touch buffer layer, a touch line disposed under the touch electrode and electrically connected to the touch electrode through a touch contact hole, a bank covering the touch electrode and including an opening in which the light emitting area is placed, and an emission layer and a cathode electrode sequentially disposed on the anode electrode; and a touch circuit configured to supply a touch driving signal to the touch electrode through the touch line, and sense a touch based on a touch sensing signal obtained through the touch electrode to which the touch driving signal is applied.

According to aspects of the present disclosure, a display panel can be provided that includes: a transistor disposed over a substrate; a first planarization layer and a second planarization layer disposed over the transistor; a touch electrode disposed in a non-light emitting area on the second planarization layer; a touch buffer layer disposed to cover the touch electrode; an anode electrode including an overlap area overlapping a portion of the touch electrode in a non-light emitting area on the touch buffer layer, and electrically connected to the transistor; a touch line electrically connected to the touch electrode through a touch contact hole; a bank covering the anode electrode and including an opening in which the light emitting area is placed; and an emission layer and a cathode electrode sequentially disposed on the anode electrode.

According to aspects of the present disclosure, a touch display device can be provided that includes: a display panel including a transistor disposed over a substrate, a first planarization layer and a second planarization layer disposed over the transistor, a touch electrode disposed in a non-light emitting area on the second planarization layer, a touch buffer layer disposed to cover the touch electrode, an anode electrode including an overlap area overlapping a portion of the touch electrode in a non-light emitting area on the touch buffer layer, and electrically connected to the transistor, a touch line electrically connected to the touch electrode through a touch contact hole, a bank covering the touch electrode and including an opening in which the light emitting area is placed, and an emission layer and a cathode electrode sequentially disposed on the anode electrode; and a touch circuit configured to supply a touch driving signal to the touch electrode through the touch line, and sense a touch based on a touch sensing signal obtained through the touch electrode to which the touch driving signal is applied.

According to one or more embodiments of the present disclosure, a touch display device and a display panel may be provided that are capable of increasing areas of touch electrodes and improving touch performance.

According to one or more embodiments of the present disclosure, a touch display device and a display panel may be provided that include a structure in which a portion of a touch electrode overlaps a portion of an anode electrode while the touch electrode is located over or under the anode electrode, and thereby, are capable of increasing the area of the touch electrode and improving touch performance.

According to one or more embodiments of the present disclosure, a touch display device and a display panel may be provided that include a structure in which a touch electrode and a touch line are interconnected by a touch jumping line disposed in the same layer as an anode electrode, and thereby, are capable of simplifying a manufacturing process and improving touch performance.

According to one or more embodiments of the present disclosure, a touch display device and a display panel may be provided that include a structure in which spacers configured to oppose each other are formed over the touch electrode, and thereby, are capable of increasing a path of forming touch capacitance, and improving touch performance.

BRIEF DESCRIPTION OF THE SEVERAL VIEWS OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings.

DETAILED DESCRIPTION

Figure 1:
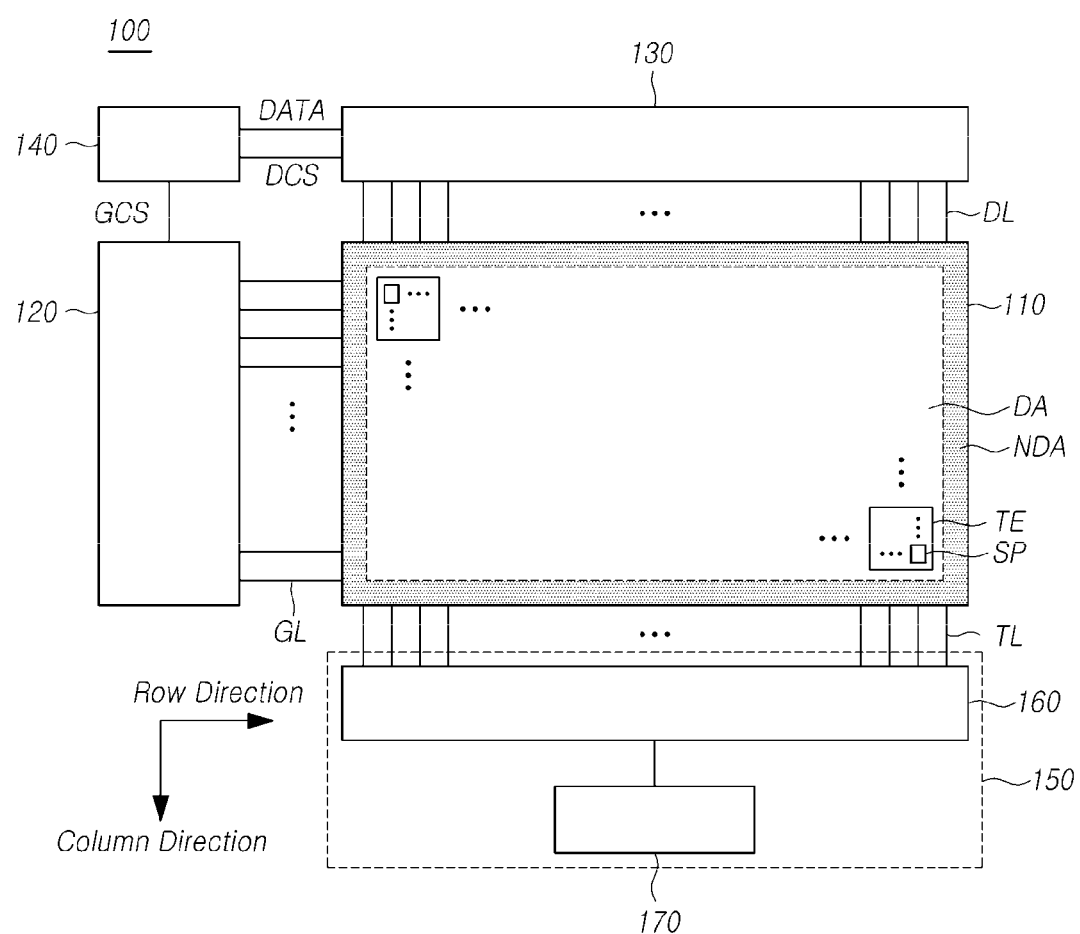
FIG. 1 illustrates an example touch display device according to aspects of the present disclosure.

Hereinafter, some embodiments of the present disclosure will be described in detail with reference to exemplary drawings. Reference will now be made in detail to embodiments of the present disclosure, examples of which may be illustrated in the accompanying drawings. In the following description, the structures, embodiments, implementations, methods and operations described herein are not limited to the specific example or examples set forth herein and may be changed as is known in the art, unless otherwise specified. Like reference numerals designate like elements throughout, unless otherwise specified. Names of the respective elements used in the following explanations are selected only for convenience of writing the specification and may thus be different from those used in actual products. Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

In the following description, where the detailed description of the relevant known function or configuration may unnecessarily obscure aspects of the present disclosure, a detailed description of such known function or configuration may be omitted. The shapes, sizes, ratios, angles, numbers, and the like, which are illustrated in the drawings to describe various example embodiments of the present disclosure, are merely given by way of example. Therefore, the present disclosure is not limited to the illustrations in the drawings. Where the terms "comprise," "have," "include," "contain," "constitute," "make up of," "formed of," and the like are used, one or more other elements may be added unless the term, such as "only," is used. An element described in the singular form is intended to include a plurality of elements, and vice versa, unless the context clearly indicates otherwise.

Although the terms "first," "second," A, B, (a), (b), and the like may be used herein to describe various elements, these elements should not be interpreted to be limited by these terms as they are not used to define a particular order or precedence. These terms are used only to distinguish one element from another. For example, a first element could be termed a second element, and, similarly, a second element could be termed a first element, without departing from the scope of the present disclosure.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top," "bottom," "downward," "upward," "upper," "lower," and the like refer to an arbitrary frame of reference.

In addition, when any dimensions, relative sizes etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "May" fully encompasses all the meanings of the term "can."

Hereinafter, various embodiments of the present disclosure will be described in detail with reference to the accompanying drawings.

FIG. 1 illustrates an example touch display device 100 according to aspects of the present disclosure.

Referring to FIG. 1, in one or more embodiments, a touch display device 100 according to aspects of the present disclosure may include a display panel 110, a data driving circuit 130, a gate driving circuit 120, a timing controller 140, and the like as components for displaying one or more images.

The display panel 110 may include a display area DA in which one or more images can be displayed and a non-display area NDA in which an image is not displayed.

The non-display area NDA may be an area outside of the display area DA, and may also be referred to as an edge area or a bezel area. At least a portion of the non-display area NDA may be bent to be invisible from the front surface of the touch display device 100 or may be covered by a case or housing (not shown) of the touch display device 100.

The display panel 110 may include a plurality of subpixels SP. In one or more embodiments, the touch display device 100 according to aspects of the present disclosure may be a liquid crystal display device, an organic light emitting display device, a micro light emitting diode (m LED) display device, a quantum dot display device, or the like.

The structure of each of the plurality of subpixels SP may vary according to the types of touch display devices 100. For example, in an example where the touch display device 100 is a self-emission display device including self-emission subpixels SP, each subpixel SP may include a self-emission light emitting element, one or more transistors, and one or more capacitors.

The display panel 110 may further include various types of signal lines to drive the plurality of subpixels SP. The various types of signal lines arranged in the touch display device 100 may include, for example, a plurality of data lines DL for carrying data signals (which may be also referred to as data voltages or image signals), a plurality of gate lines GL for carrying gate signals (which may be also referred to as scan signals), and the like.

The plurality of data lines DL and the plurality of gate lines GL may intersect each other. Each of the plurality of data lines DL may be disposed while extending in a column direction. Each of the plurality of gate lines GL may be disposed while extending in a row direction.

The column direction and the row direction may refer to directions relative to each other. For example, the column direction may be the vertical direction and the row direction may be the horizontal direction. In another example, the column direction may be the horizontal direction and the row direction may be the vertical direction.

The data driving circuit 130 may be a circuit for driving the plurality of data lines DL, and can supply data signals to the plurality of data lines DL. The gate driving circuit 120 may be a circuit for driving the plurality of gate lines GL, and can supply gate signals to the plurality of gate lines GL.

The timing controller 140 may be a device for controlling the data driving circuit 130 and the gate driving circuit 120, and can control driving timing for the plurality of data lines DL and driving timing for the plurality of gate lines GL.

The timing controller 140 can supply several types of data driving control signals DCS to the data driving circuit 130 to control the data driving circuit 130, and supply several types of gate driving control signals GCS to the gate driving circuit 120 to control the gate driving circuit 120.

The data driving circuit 130 can supply data signals to the plurality of data lines DL according to driving timing control of the timing controller 140. The data driving circuit 130 can receive the digital image data DATA from the timing controller 140, convert the received image data DATA into analog data signals, and supply the resulting analog data signals to the plurality of data lines DL.

The gate driving circuit 120 can supply gate signals to the plurality of gate lines GL according to the timing control of the timing controller 140. The gate driving circuit 120 can receive a first gate voltage corresponding to a turn-on level voltage and a second gate voltage corresponding to a turn-off level voltage along with various gate driving control signals GCS, generate gate signals, and supply the generated gate signals to the plurality of gate lines GL. For example, the turn-on level voltage may be a high level of voltage, and the turn-off level voltage may be a low level of voltage. In another example, the turn-on level voltage may be a low level of voltage, and the turn-off level voltage may be a high level of voltage.

In one or more embodiments, in order to further provide a touch sensing function, as well as an image display function, the touch display device 100 may include a touch panel, and a touch circuit 150 capable of detecting whether a touch event occurs by a touch object such as a finger, a pen, or the like, or detecting a corresponding touch position, by sensing the touch panel.

The touch circuit 150 may include a touch driving circuit 160 capable of generating and providing touch sensing data by driving and sensing the touch panel, a touch controller 170 capable of detecting the occurrence of a touch event or detecting a touch position (or touch coordinates) using the touch sensing data, and the like.

The touch panel may include a plurality of touch electrodes TE as a touch sensor. The touch panel may further include a plurality of touch lines TL for electrically interconnecting the plurality of touch electrodes TE and the touch driving circuit 160. The touch panel, or all, or one or more, of touch electrodes TE may be also referred to as a touch sensor.

The touch panel may be placed outside of the display panel 110 or inside of the display panel 110. An example where a touch panel is present outside of the display panel 110 may be referred to as an add-on type touch panel. In the example where the touch panel is implemented in the add-on type, the touch panel and the display panel 110 may be separately manufactured and then combined in an assembly process. The add-on type touch panel may include a substrate and a plurality of touch electrodes TE over the substrate.

An example where a touch panel is present inside of the display panel 110 may be referred to as an integrated type touch panel (which may be referred to as an in-cell type touch panel, an on-cell type touch panel, or the like.). In the example where the touch panel is implemented in the integrated type, the touch panel may be formed inside of the display panel during the manufacturing process of the display panel 110.

The touch driving circuit 160 can supply a touch driving signal to at least one of a plurality of touch electrodes TE, detect a touch sensing signal through the at least one of the plurality of touch electrodes TE, and generate touch sensing data based on the detected touch sensing signal.

The touch circuit 150 can perform touch sensing using a self-capacitance sensing technique or a mutual-capacitance sensing technique.

In an example where the touch circuit 150 performs touch sensing in the self-capacitance sensing technique, the touch circuit 150 can perform touch sensing based on capacitance between each touch electrode TE and a touch object (e.g., a finger, a pen, or the like.).

In an example where the touch circuit 150 performs touch sensing in the mutual-capacitance sensing technique, the touch circuit 150 can perform touch sensing based on capacitance between touch electrodes TE.

According to the mutual-capacitance sensing technique, a plurality of touch electrodes may be divided into one or more driving touch electrodes and one or more sensing touch electrodes. The touch driving circuit 160 can drive the one or more driving touch electrodes using a touch driving signal and detect at least one touch sensing signal from the one or more sensing touch electrodes.

According to the self-capacitance sensing technique, each of a plurality of touch electrodes can serve as both a driving touch electrode and a sensing touch electrode. The touch driving circuit 160 can drive all, or one or more, of the plurality of touch electrodes and sense all, or one or more, of the plurality of touch electrodes.

The touch driving circuit 160 and the touch controller 170 may be implemented in separate devices or in a single device.

In one embodiment, each of the touch driving circuit 160 and the data driving circuit 130 may be implemented in a respective integrated circuit. In another embodiment, all or at least part of the touch driving circuit 160 and all or at least part of the data driving circuit 130 may be integrated into each other and implemented in a single integrated circuit.

In one or more embodiments, the touch display device 100 according to aspects of the present disclosure may be a self-emission display device in which self-emission light emitting elements are disposed in the display panel 110. The self-emission display device may include, for example, an organic light emitting display device, a quantum dot display device, a micro LED display device, and the like.

Figure 2:
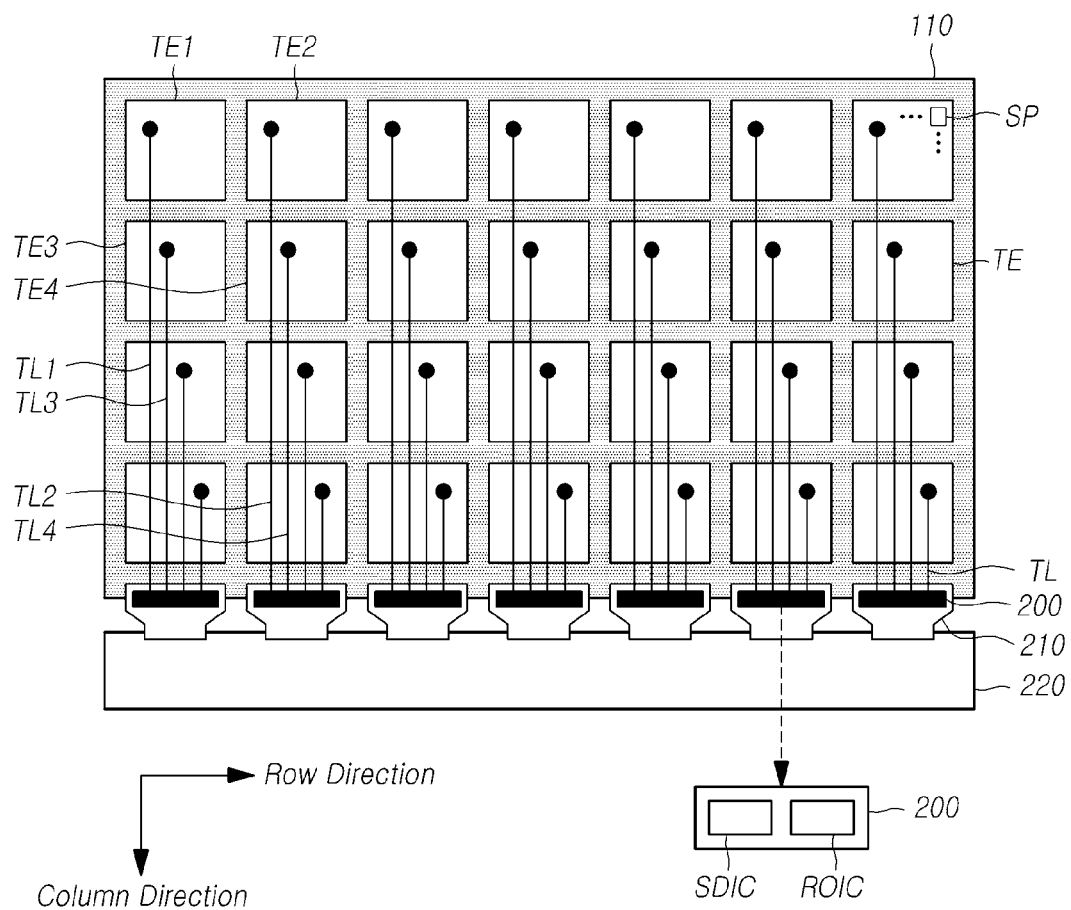
FIG. 2 illustrates an example touch sensing system in the touch display device according to aspects of the present disclosure.

FIG. 2 is an example cross-sectional view of the display panel 110 in the touch display device 100 according to aspects of the present disclosure.

Referring to FIG. 2, in one or more embodiments, a touch sensing system of the touch display device 100 according to aspects of the present disclosure may include a plurality of touch electrodes TE, a plurality of touch lines TL, the touch driving circuit 160, the touch controller 170, and the like.

In one or more embodiments, in the touch display device 100 according to aspects of the present disclosure, the data driving circuit 130 may include a plurality of data driving integrated circuits SDIC, and the touch driving circuit 160 may include a plurality of touch driving integrated circuits ROIC.

For example, each of the plurality of data driving integrated circuits SDIC may be implemented in a respective integrated circuit. Each of the plurality of touch driving integrated circuits ROIC may be implemented in a respective integrated circuit.

In another example, at least one data driving integrated circuit SDIC and at least one touch driving integrated circuit ROIC may be integrated into each other and implemented in one integrated circuit 200.

In this example, the touch display device 100 according to aspects of the present disclosure may include one or more integrated circuits 200, and each integrated circuit 200 may include at least one data driving integrated circuit SDIC and at least one touch drive integrated circuit ROIC.

For example, in the touch display device 100 according to aspects of the present disclosure, each of the plurality of integrated circuits 200 may be mounted on a respective circuit film 210. For example, each one side of the respective circuit film 210 on which each of the plurality of integrated circuits 200 is mounted may be electrically connected to the display panel 110.

In another embodiment, each of the plurality of integrated circuits 200 may be directly mounted on a bezel area of the display panel 110.

Each the other side of the respective circuit film 210 on which each of the plurality of integrated circuits 200 is mounted may be electrically connected to a printed circuit board 220.

In one or more embodiments, in the touch display device 100 according to aspects of the present disclosure, each of a plurality of touch electrodes TE may be electrically connected to the touch driving integrated circuit ROIC through at least one touch line TL.

All of the plurality of touch electrodes TE may be located in a same layer, and a plurality of touch lines TL may be located in a different layer from the plurality of touch electrodes TE.

The plurality of touch electrodes TE may include a first touch electrode TE1, a second touch electrode TE2 adjacent to the first touch electrode TE1 in a row direction, a third touch electrode TE3 adjacent to the first touch electrode TE1 in a column direction, and a fourth touch electrode TE4 adjacent to the third touch electrode TE3 in the row direction.

The first touch electrode TE1 may be electrically connected to a first touch line TL1, the second touch electrode TE2 may be electrically connected to a second touch line TL2, the third touch electrode TE3 may be electrically connected to a third touch line TL3, and the fourth touch electrode TE4 may be electrically connected to a fourth touch line TL4.

The first touch line TL1 may overlap the third touch electrode TE3 but may not be electrically connected to the third touch electrode TE3. The second touch line TL2 may overlap the fourth touch electrode TE4 but may not be electrically connected to the fourth touch electrode TE4.

Each of the plurality of touch electrodes TE may overlap one or more subpixels SP.

For example, one touch electrode TE may overlap two or more subpixels SP. In another example, an area size of one touch electrode TE may correspond to an area size of two or more subpixels SP. In this example, each of the plurality of touch electrodes TE may overlap two or more data lines DL and may overlap two or more gate lines GL.

The first touch electrode TE1 and the second touch electrode TE2 may be disposed in the same touch electrode row, and thereby, may overlap same two or more gate lines GL. The third touch electrode TE3 and the fourth touch electrode TE4 may be disposed in the same touch electrode row, and thereby, may overlap same two or more gate lines GL.

The first touch electrode TE1 and the third touch electrode TE3 may be disposed in the same touch electrode column, and thereby, may overlap same two or more data lines DL. The second touch electrode TE2 and the fourth touch electrode TE4 may be disposed in the same touch electrode column, and thereby, may overlap same two or more data lines DL.

Each of the plurality of touch electrodes TE may be a mesh type electrode in which a plurality of openings are formed. Each of the plurality of openings in each touch electrode TE may correspond to a light emitting area or a transmission area (or a transparent area) of a corresponding subpixel SP.—

Figure 3:
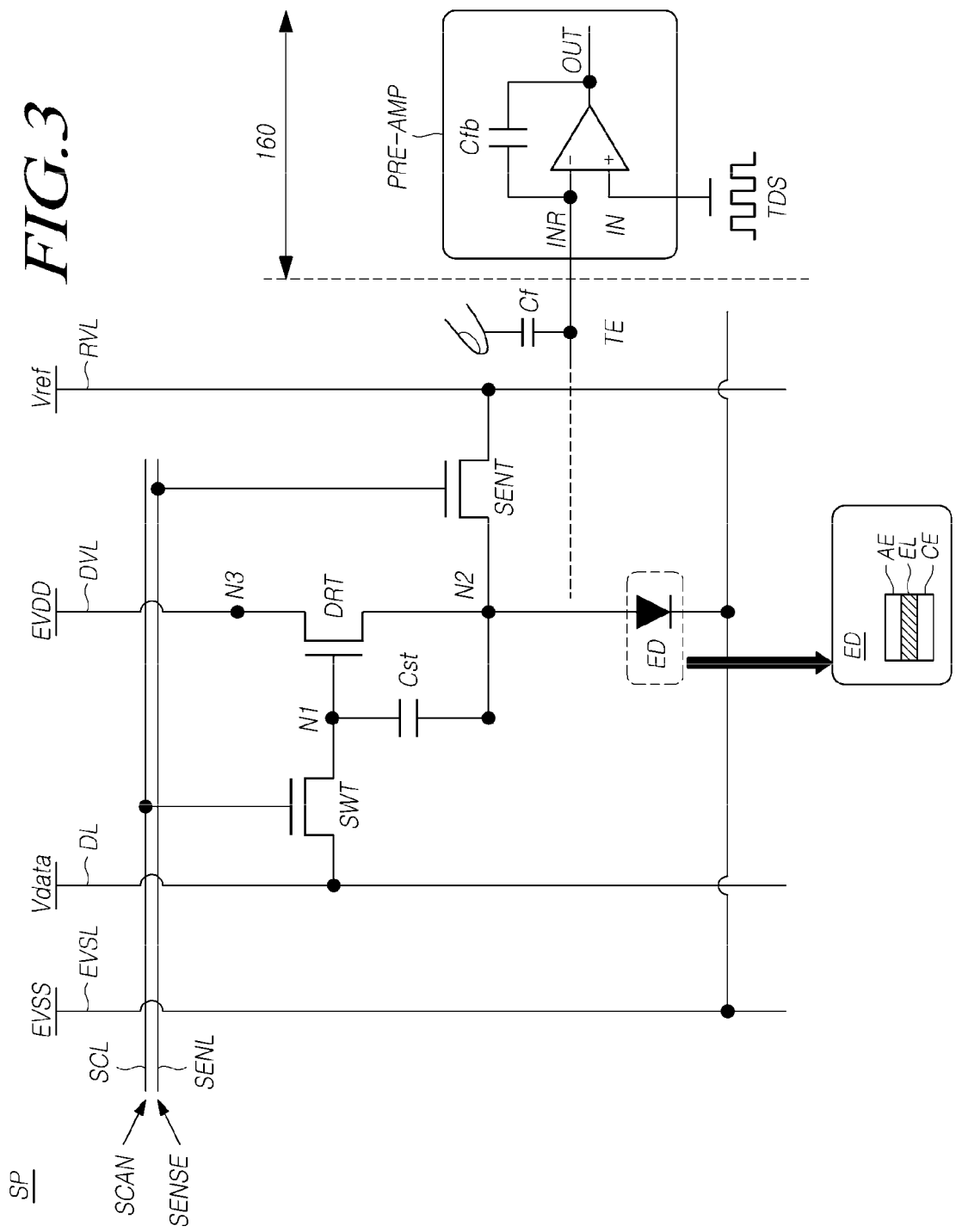
FIG. 3 illustrates an example equivalent circuit of a subpixel included in a display panel in the touch display device according to aspects of the present disclosure.

FIG. 3 illustrates an example equivalent circuit of a subpixel included in the display panel 110 of the touch display device 100 according to aspects of the present disclosure.

Referring to FIG. 3, in one or more embodiments, in the touch display device 100 according to aspects of the present disclosure, each of a plurality of subpixels SP may include a light emitting element ED, a driving transistor DRT for driving the light emitting element ED, a switching transistor SWT for switching an electrical interconnection between the gate electrode of the driving transistor DRT and a data line DL, and a storage capacitor Cst electrically connected between the gate electrode of the driving transistor DRT and the source electrode or drain electrode of the driving transistor DRT.

The gate electrode of the driving transistor DRT may correspond to a first node N1. The source electrode or the drain electrode of the driving transistor DRT may correspond to a second node N2. The drain electrode or the source electrode of the driving transistor DRT may correspond to a third node N3.

The light emitting element ED may include an anode electrode AE, an emission layer EL, and a cathode electrode CE. The emission layer EL may be located on the cathode electrode CE, and the anode electrode AE may be located on the emission layer EL. For example, the light emitting element ED may be a self-emission light emitting element, and may include an organic light emitting diode (OLED), a light emitting element configured with quantum dots, a micro light emitting diode (m LED), or the like.

The anode electrode AE may be sometimes referred to as a pixel electrode, and the cathode electrode CE may be sometimes referred to as a common electrode.

The drain electrode or the source electrode of the switching transistor SWT may be electrically connected to the data line DL to which a data voltage Vdata is applied. The source electrode or drain electrode of the switching transistor SWT may be electrically connected to the gate electrode of the driving transistor DRT at the first node N1. The gate electrode of the switching transistor SWT may be electrically connected to a scan signal line SCL, which is one of gate lines GL. The turn-on and turn-off of the switching transistor SWT can be controlled by the scan signal SCAN supplied from the scan signal line SCL.

The storage capacitor Cst may be electrically connected between the first node N1 and the second node N2. The storage capacitor Cst can serve to maintain a voltage difference between the first node N1 and the second node N2 for a predefined time (for example, one frame time). The storage capacitor Cst may not be an internal capacitor (e.g., one or more parasitic capacitors) formed inside of the driving transistor DRT, but an external capacitor intentionally designed to drive the subpixel SP.

Although the foregoing discussions have been provided based on the example where each subpixel SP includes the light emitting element ED, two transistors (DRT and SWT), and one capacitor Cst, it should be however noted that each subpixel SP may further include one or more transistors and/or one or more capacitors according to design considerations.

For example, as shown in FIG. 3, each subpixel SP may further include a sensing transistor SENT for controlling an interconnection between the second node N2 of the driving transistor DRT and a reference voltage line RVL to which a reference voltage Vref is applied.

The drain electrode or the source electrode of the sensing transistor SENT may be electrically connected to the reference voltage line RVL. The source electrode or drain electrode of the sensing transistor SENT may be electrically connected to the source electrode or drain electrode of the driving transistor DRT at the second node N2 and be electrically connected to the anode electrode AE as well. The gate electrode of the sensing transistor SENT may be electrically connected to a sense signal line SENL, which is one of gate lines GL. The turn-on and turn-off of the sensing transistor SENT can be controlled by the sense signal SENSE supplied from the sense signal line SENL.

A respective anode electrode AE may be disposed in each of the plurality of subpixels SP and may be electrically connected to the source electrode or drain electrode of each driving transistor DRT. That is, as shown in FIG. 3, at the second node N2, the anode electrode AE may be electrically connected to the source electrode or the drain electrode of the driving transistor DRT.

The third node N3 of the driving transistor DRT may be electrically connected to a driving voltage line DVL to which a high level driving voltage EVDD is applied, and may be the drain electrode or the source electrode thereof.

At this implementation, during a display driving period, a high level of driving voltage EVDD required to display an image can be supplied to the driving voltage line DVL. For example, the high level of driving voltage EVDD required to display an image may be 27V.

The driving transistor DRT can be turned on by a voltage difference between the first node N1 and the third node N3 and supply a driving current to the light emitting element ED.

The cathode electrode CE may be commonly disposed in a plurality of subpixels SP. A base voltage EVSS of a direct current level without a change in voltage level may be applied to the cathode electrode CE. The base voltage EVSS may be a common voltage commonly applied to light emitting elements ED of all or at least some of the subpixels SP.

In one or more embodiments, in the touch display device 100 according to aspects of the present disclosure, the display panel 110 may further include a plurality of base lines EVSL electrically connected to the cathode electrode CE.

Through the plurality of base lines EVSL, the base voltage EVSS can be uniformly applied to the entire area of the cathode electrode CE. The technique of supplying such a base voltage EVSS using the plurality of base lines EVSL can provide an advantage of effectively supplying the base voltage EVSS to a large area of cathode electrode CE in examples where a large area of display panel 110 is employed.

The touch driving circuit 160 may include one or more preamplifiers PRE-AMP. The preamplifier PRE-AMP may include a non-inverting input terminal IN to which a touch driving signal TDS is input, an inverting input terminal INR electrically connected to a touch electrode TE, an output terminal OUT through which an output signal is output, and a feedback capacitor Cfb connected between the non-inverting input terminal IN and the output terminal OUT.

According to one or more embodiments of the present disclosure, the touch display device 100 and the display panel 110 can be provided that include a structure in which a portion of a touch electrode TE overlaps a portion of an anode electrode AE while the touch electrode TE is located over or under the anode electrode AE, and thereby, are capable of increasing the area of the touch electrode TE and improving touch performance.

Accordingly, the inverting input terminal INR of the preamplifier PRE-AMP may be electrically connected to a touch electrode TE, which is disposed such that a portion of the touch electrode TE overlaps the anode electrode AE of the light emitting element ED.

A touch driving signal TDS applied to the non-inverting input terminal IN of the preamplifier PRE-AMP may be a signal whose voltage level is varied and may have a predefined frequency and amplitude.

When a user touches the display panel (e.g., a touch screen thereof) using a touch object such as a finger, a pen, or the like, capacitance Cf may be formed between a corresponding touch electrode TE and the touch object. This capacitance Cf may be referred to as a finger capacitance Cf.

The touch circuit 150 of the touch display device 100 can sense touch coordinates based on a change in finger capacitance Cf of each touch electrode TE.

Figure 4:
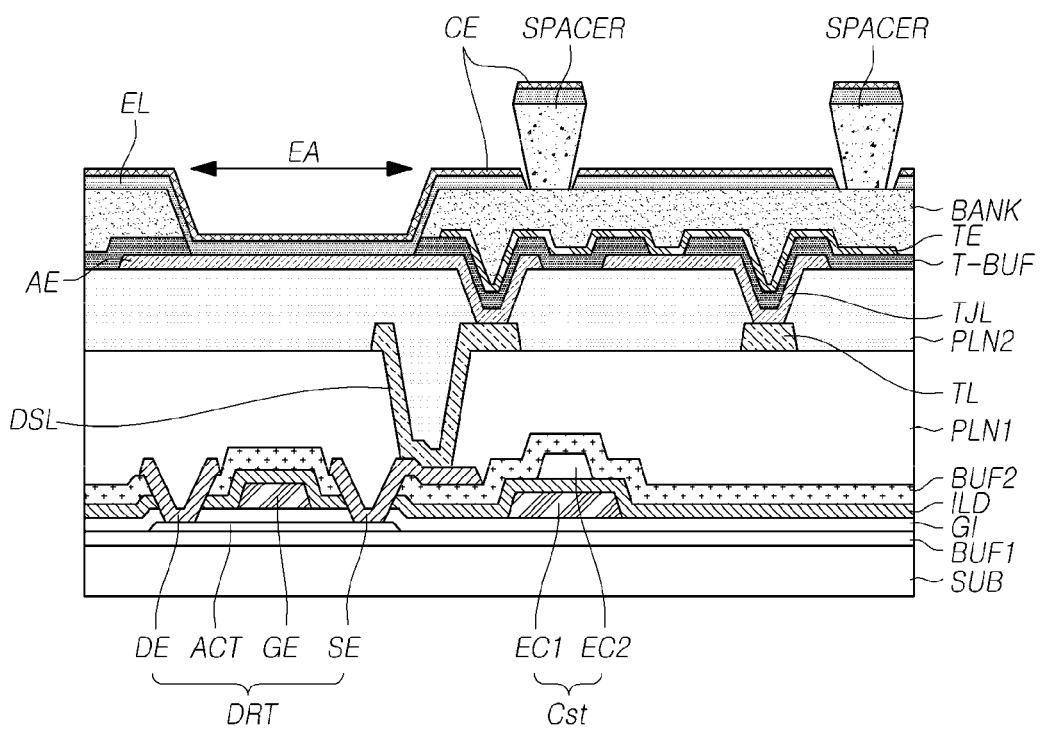
FIG. 4 is an example cross-sectional view of a display panel in the touch display device according to aspects of the present disclosure.

FIG. 4 is an example cross-sectional view of the display panel 110 in the touch display device 100 according to aspects of the present disclosure. FIGS. 5 to 12 are cross-sectional views and plan views illustrating stages performed in the process of manufacturing the display panel 110 of the touch display device 100 according to aspects of the present disclosure.

Referring to FIGS. 4 to 12, in one or more embodiments, the display panel 110 of the touch display device 100 according to aspects of the present disclosure may include a substrate SUB.

A plurality of subpixels SP are disposed over the substrate. Each of the plurality of subpixels SP may include a light emitting element ED including an anode electrode AE, an emission layer EL, and a cathode electrode CE, a driving transistor DRT for driving the light emitting element ED, and a storage capacitor Cst for maintaining a voltage between the gate electrode and the source electrode (or drain electrode) of the driving transistor DRT.

Transistors (DRT, SWT, and SENT) and at least one capacitor Cst may be disposed over the substrate SUB, and light emitting elements ED may be disposed over the substrate SUB. The source electrode SE of the driving transistor DRT may be electrically connected to the anode electrode AE of the light emitting element ED. It should be noted that for convenience of explanation, in the examples of FIGS. 4 to 12, a switching transistor SWT and a sensing transistor SENT are omitted.

An encapsulation layer may be disposed on the cathode electrode CE of light emitting elements ED. The encapsulation layer can prevent oxygen or moisture from penetrating into the light emitting devices ED.

A first buffer layer BUF1 may be disposed on the substrate SUB.

The driving transistor DRT may be disposed on the first buffer layer BUF1.

A semiconductor layer ACT of the driving transistor DRT may be disposed on the first buffer layer BUF1.

A gate insulating layer GI may be disposed on the semiconductor layer ACT of the driving transistor DRT.

The gate electrode GE of the driving transistor DRT and a first capacitor electrode EC1 of the storage capacitor Cst may be located on the gate insulating layer GI. The gate electrode GE of the driving transistor DRT and the first capacitor electrode EC1 of the storage capacitor Cst may be formed in a same layer and include a same material.

An interlayer insulating layer ILD may be disposed on the gate electrode GE of the driving transistor DRT and the first capacitor electrode EC1 of the storage capacitor Cst.

A second capacitor electrode EC2 of the storage capacitor Cst may be disposed on the interlayer insulating layer ILD.

A second buffer layer BUF2 may be disposed such that it covers the second capacitor electrode EC2 and the interlayer insulating layer ILD.

The source electrode SE and the drain electrode DE of the driving transistor DRT may be disposed on the second buffer layer BUF2. The source electrode SE and the drain electrode DE of the driving transistor DRT may include a same material.

The storage capacitor Cst may be configured as a structure including the first capacitor electrode EC1 and the second capacitor electrode EC2.

The source electrode SE and the drain electrode DE of the driving transistor DRT may be electrically connected to the semiconductor layer ACT of the driving transistor DRT through contact holes formed in the interlayer insulating layer ILD.

A first planarization layer PLN1 may be disposed on the second buffer layer BUF2 such that it covers the source electrode SE and the drain electrode DE located on the second buffer layer BUF2.

A driving signal line DSL for enabling a driving current to be supplied to the light emitting element ED and a touch line TL for delivering a touch signal (e.g., a touch driving signal) to a touch electrode TE may be disposed on the first planarization layer PLN1. The driving signal line DSL and the touch line TL may include the same material as the source electrode SE or drain electrode DE of the driving transistor DRT.

Figure 5:
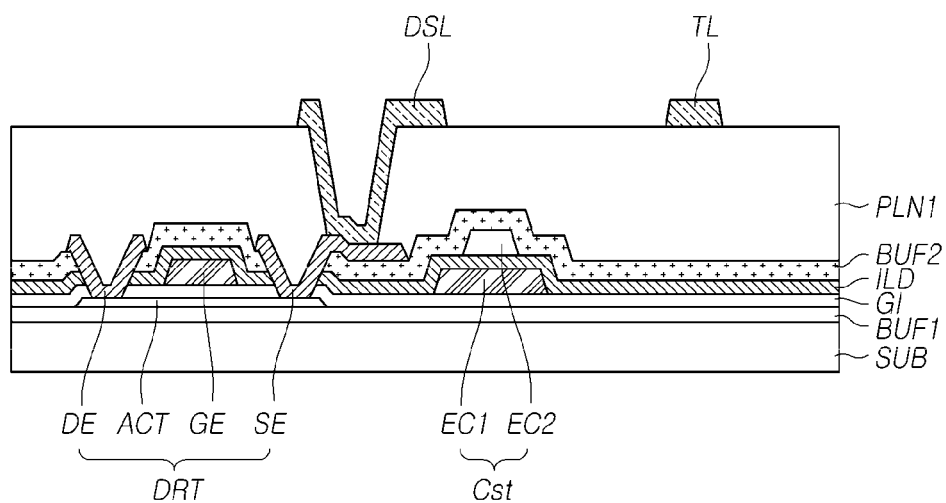
FIGS. 5 to 12 are cross-sectional views and plan views illustrating stages performed in the process of manufacturing the display panel of the touch display device according to aspects of the present disclosure.
Figure 5:
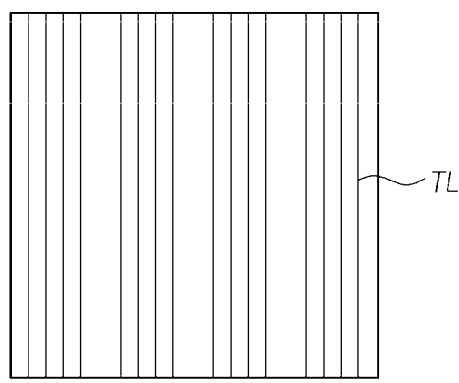

In examples where the touch circuit 150 is located in an upper edge or a lower edge of the display panel 110, the touch line TL may extend in the vertical direction as shown in FIG. 5.

The driving signal line DSL may be disposed to provide an electrical connection between the source electrode SE or drain electrode DE of the driving transistor DRT and the anode electrode AE of the light emitting element ED, and be disposed in a location overlapped with the anode electrode AE.

Further, the touch line TL may be disposed at a location overlapped with a touch electrode TE for an electrical connection with the touch electrode TE.

A second planarization layer PLN2 may be disposed on the first planarization layer PLN1 such that the second planarization layer PLN2 covers the driving signal line DSL and the touch line TL.

The anode electrode AE may be disposed on the second planarization layer PLN2 in an area defined as a light emitting area EA of the corresponding subpixel SP. The anode electrode AE may be connected to the driving signal line DSL through an anode contact hole A-CNT formed in the second planarization layer PLN2. Accordingly, the anode electrode AE may be electrically connected to the source electrode SE of the driving transistor DRT through the driving signal line DSL.

In one or more embodiments, a touch jumping line TJL may be disposed on the second planarization layer PLN2 in a non-light emitting area not overlapping the light emitting area EA of the subpixel SP. The touch jumping line TJL may be disposed in the same layer as the anode electrode AE and include the same material as the anode electrode AE. The touch jumping line TJL may be connected to the touch line TL through a first touch contact hole T-CNT1 formed in the second planarization layer PLN2. The anode electrode AE and the touch jumping line TJL may be formed in a single process.

Figure 6:
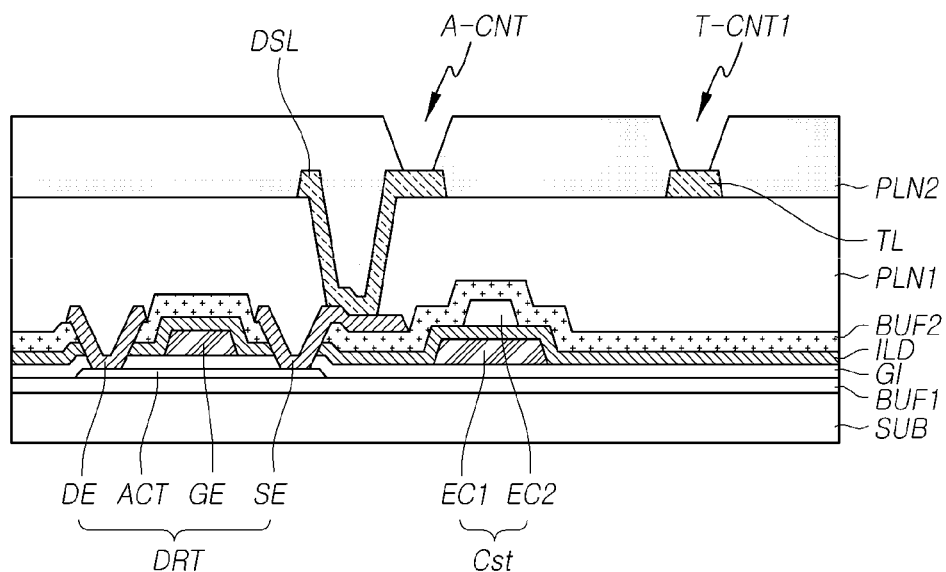
Figure 6:
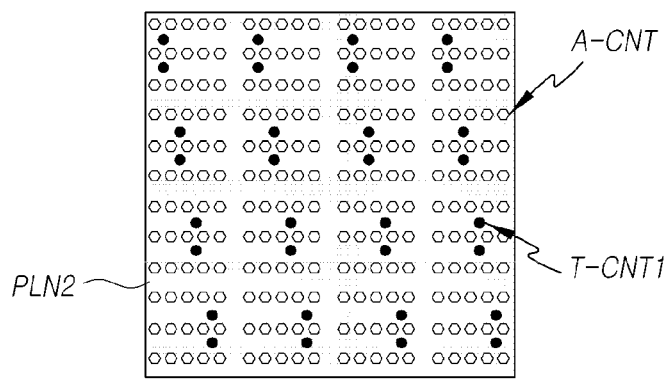
Figure 7:
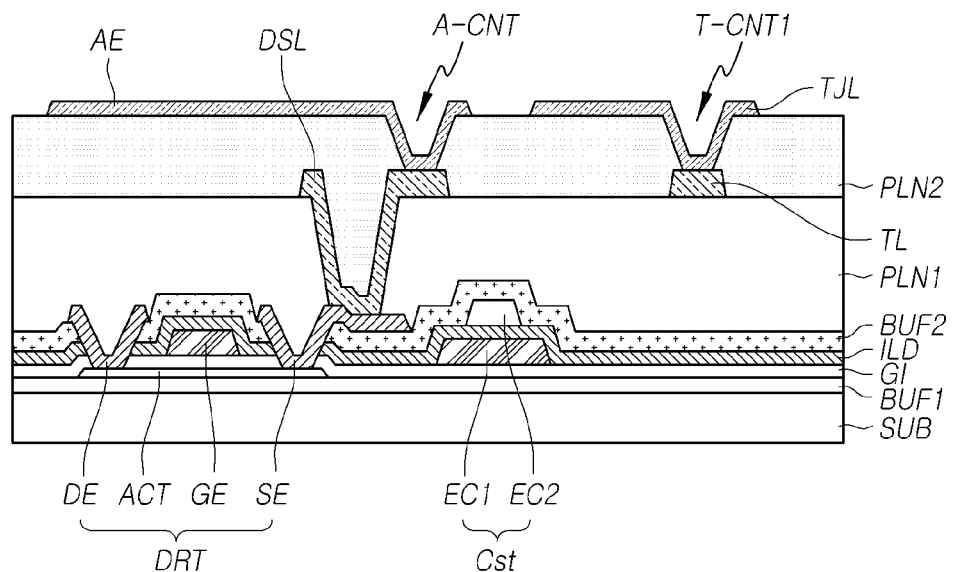
Figure 7:
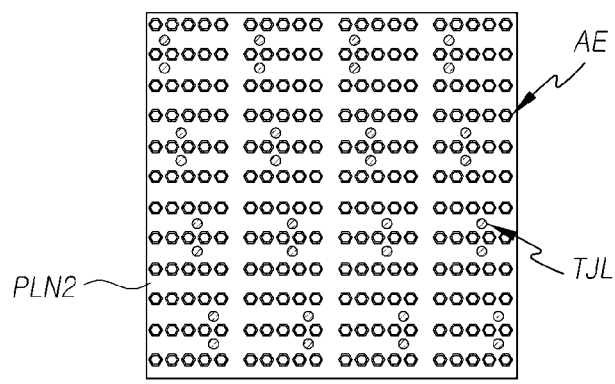

In one or more embodiments, as shown in FIGS. 6 and 7, one anode contact hole A-CNT may be formed in a respective light emitting area EA of each subpixel SP, and two or more first touch contact hole T-CNT1 may be formed in each touch electrode TE.

A touch buffer layer T-BUF may be disposed on the anode electrode AE and the touch jumping line TJL.

One or more touch electrodes TE may be disposed on the touch buffer layer T-BUF in a non-light emitting area not overlapping the light emitting area EA of the subpixel SP.

The touch electrode TE may be connected to the touch jumping line TJL through a second touch contact hole T-CNT2 of the touch buffer layer T-BUF. Accordingly, the touch electrode TE may be electrically connected to the touch line TL through the touch jumping line TJL.

Figure 8:
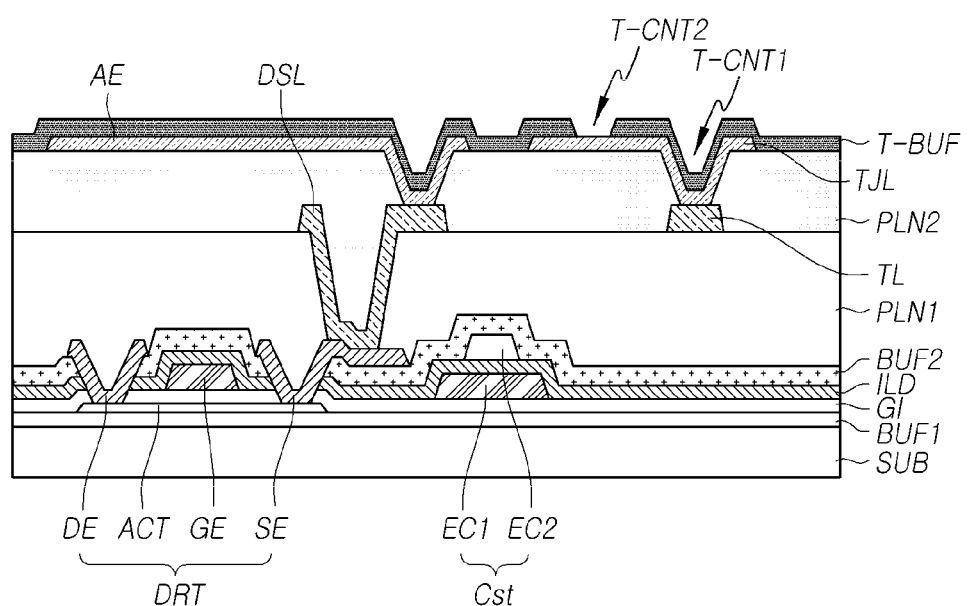
Figure 8:
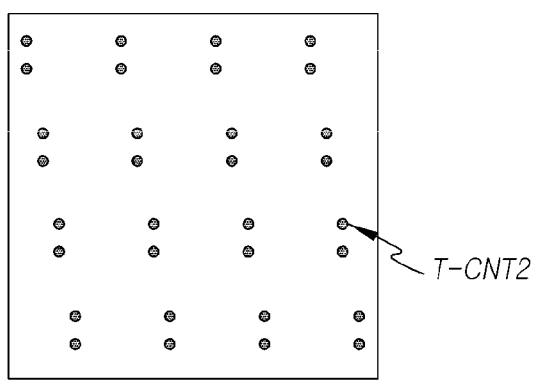

In one or more embodiments, as shown in FIG. 8, one or more second touch contact holes T-CNT2 may be formed in each touch electrode TE.

In one or more embodiments, a portion of the touch electrode TE may extend from the non-light emitting area not overlapping the light emitting area EA of the subpixel SP to a location overlapping a portion of the anode electrode AE. That is, as the touch electrode TE is disposed to extend to a location overlapping a portion of the anode electrode AE while being disposed over the anode electrode AE, the area of the touch electrode TE can be expanded, and thereby, touch performance can be improved.

In contrast, in an example where the touch electrode TE is disposed in the same layer as the anode electrode AE, the area of the touch electrode TE cannot be extended to a location overlapping the anode electrode AE. Thus, in this example, it may not be easy to expand the area of the touch electrode TE.

Figure 9:
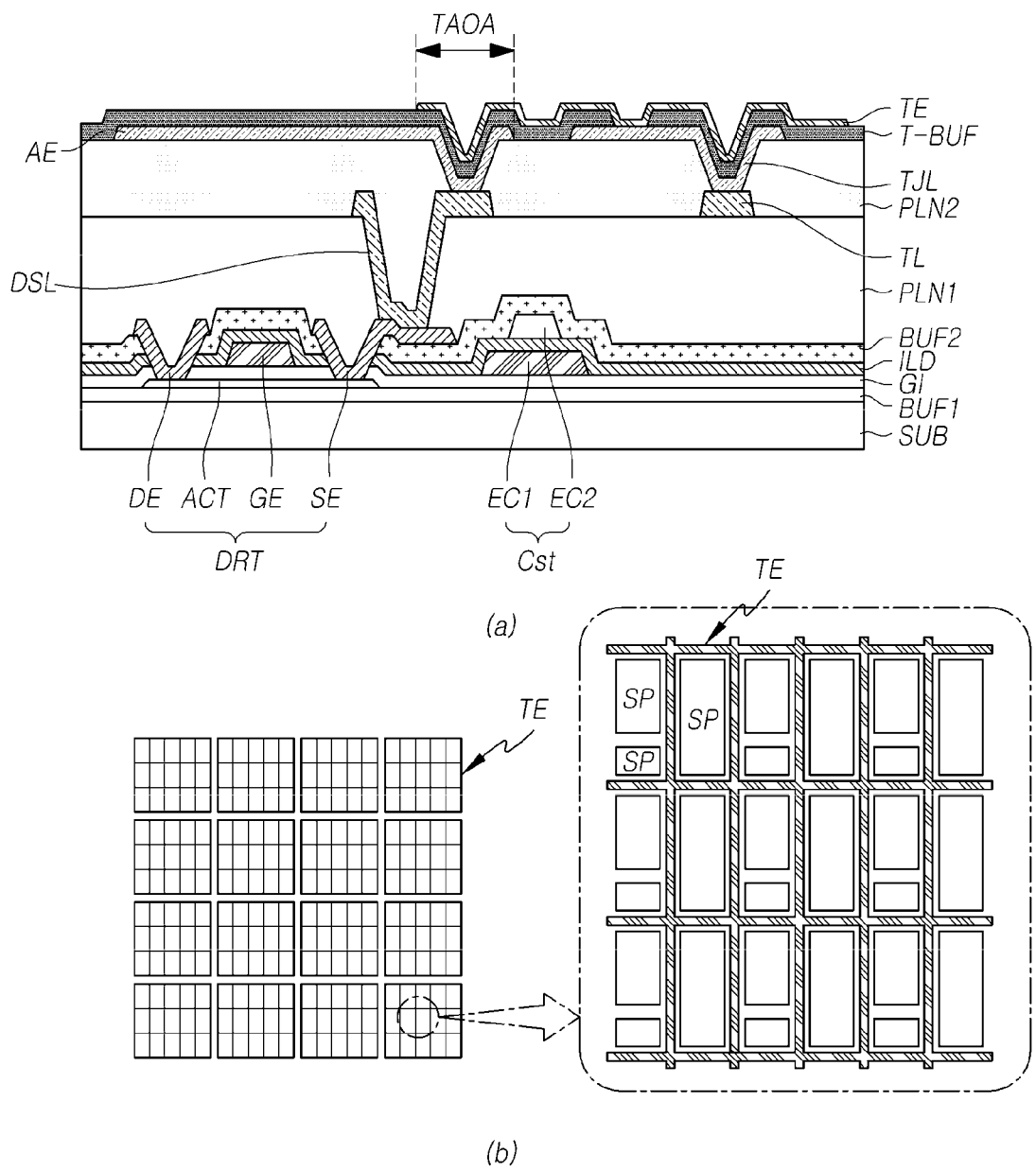

FIG. 9 illustrates an example where an overlap area TAOA between the anode electrode AE and the touch electrode TE is formed on the driving signal line DSL.

Figure 10:
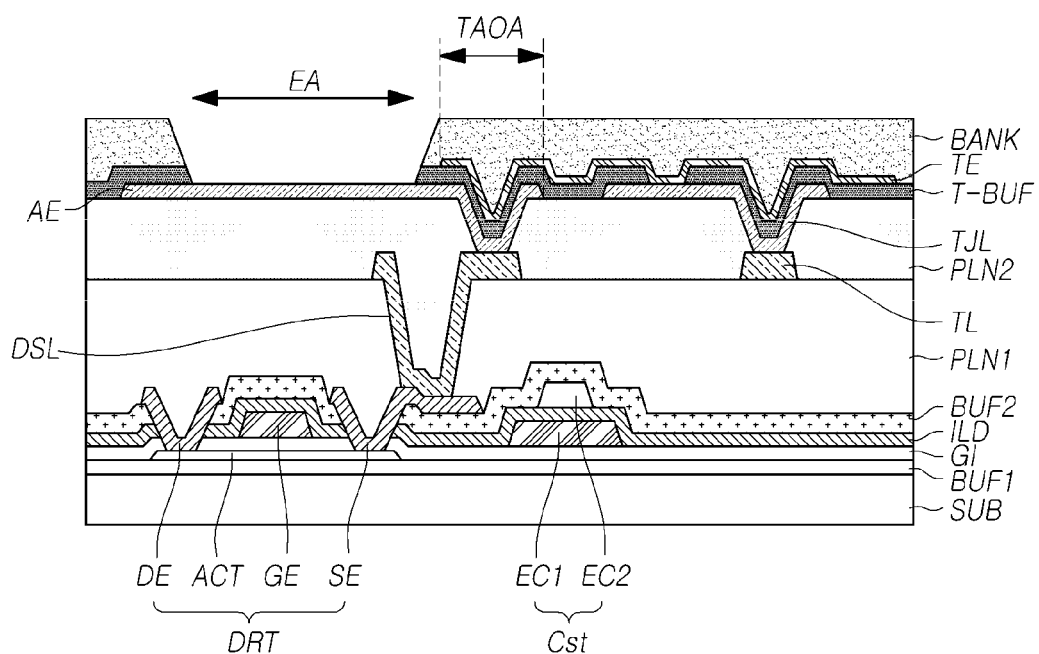
Figure 10:
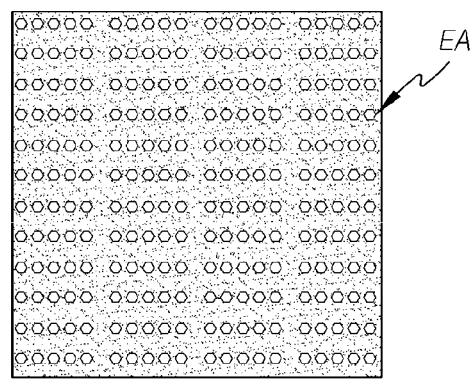

Further, as shown in FIG. 10, a bank BANK may be disposed on the anode electrode AE to define the light emitting area EA of the subpixel SP. A portion of the bank BANK may be opened to expose a portion of the anode electrode AE. Accordingly, the open area of the bank BANK may correspond to the light emitting area EA.

In one or more embodiments, it may be desirable that the overlap area TAOA of the anode electrode AE and the touch electrode TE does not overlap the light emitting area EA.

The emission layer EL may be disposed on a portion of the anode electrode AE exposed through the open area of the bank BANK, and the cathode electrode CE may be disposed on the emission layer EL.

It should be noted here that when the emission layer EL and the cathode electrode CE extended to a non-light emitting area between light emitting areas EA overlap a touch electrode TE located under the emission layer EL and the cathode electrode CE, this implementation can interfere the formation of capacitance between a touch object such as a finger or a pen and the touch electrode TE, and thereby, touch performance can be reduced.

Figure 11:
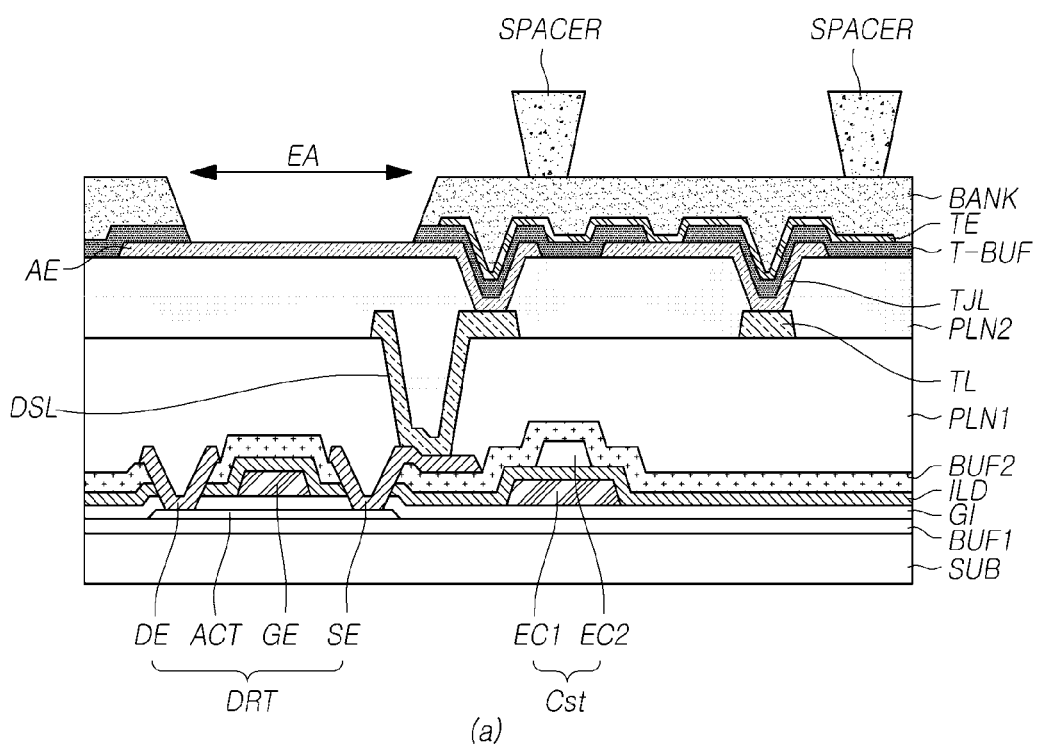
Figure 11:
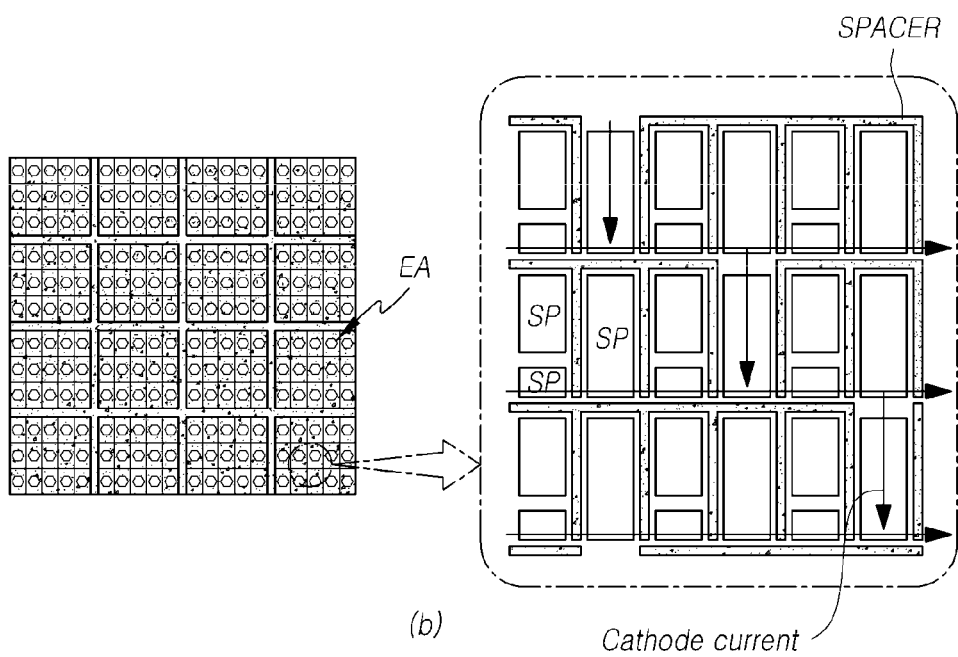

In order to prevent such an undesirable effect, as shown in FIG. 11, spacers SPACER configured to oppose each other (which may be referred to as an opposing structure) may be formed in an upper portion of the bank BANK overlapping the touch electrode TE. For example, the spacers SPACER may include at least two opposing spacers extending in the row direction and at least two opposing spacers extending in the column direction as shown in FIG. 11 (B).

Figure 12:
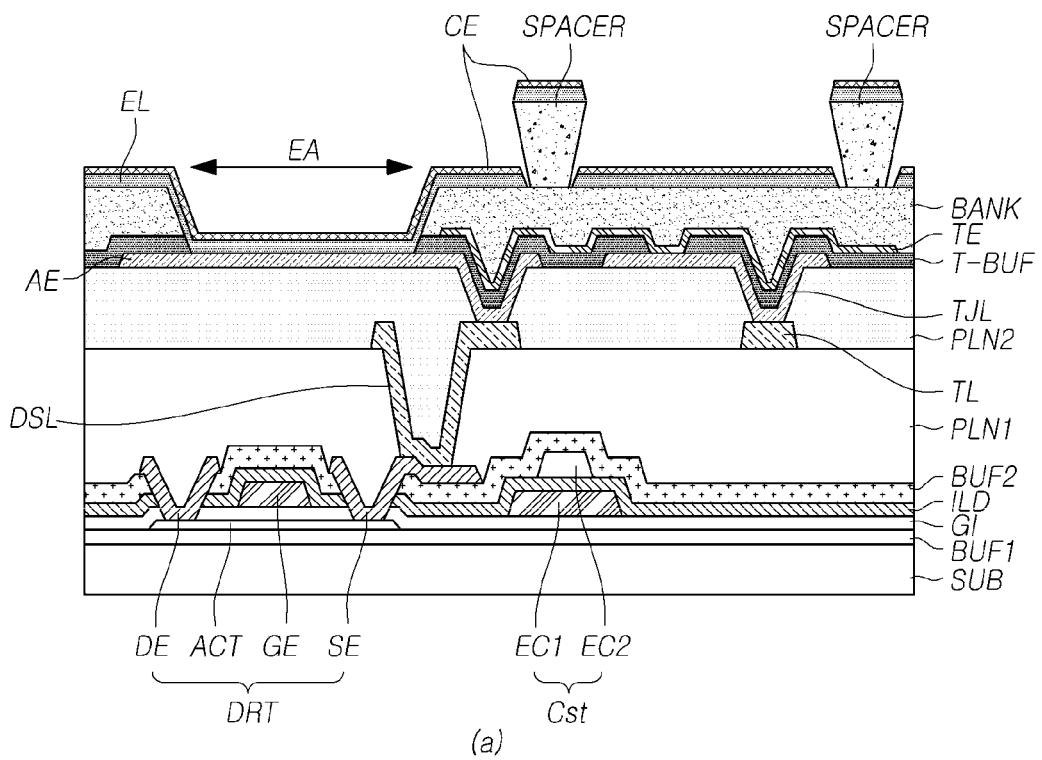
Figure 12:
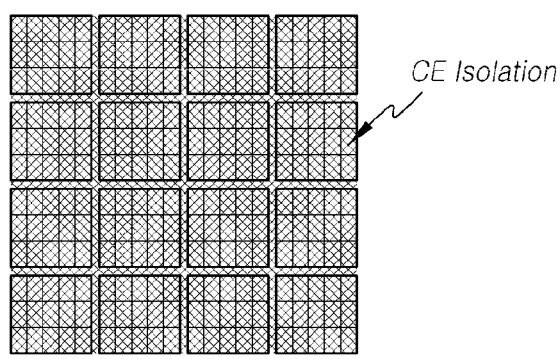

As a result, as shown in FIG. 12, the spacers SPACER configured to oppose each other can electrically disconnect between two or more respective parts of each of the emission layer EL and the cathode electrode CE located on the touch electrode TE, or electrically separate the emission layer EL and the cathode electrode CE from one or more adjacent light emitting areas EA. For example, the spacers SPACER configured to oppose each other may have a structure of surrounding, and upwardly extending in, an area where the touch electrode TE is formed between light emitting areas EA when viewed in a plan view.

Thus, the cathode electrode CE located over the touch electrode TE and isolated by the spacers SPACER configured to oppose each other (which may be referred to as an isolated cathode electrode CE) may be disposed in a lattice structure surrounded by the spacers SPACER when viewed from a plan view.

In this manner, as the spacers SPACER electrically insulates the emission layer EL and the cathode electrode CE located over the touch electrode TE, therefore, an electric field path for enabling capacitance between the touch electrode TE and a touch object such as a finger or a pen to be effectively formed can be ensured.

Therefore, the touch performance of the touch electrode TE cannot be interfered or reduced because a current flowing through the cathode electrode CE cannot flow the isolated cathode electrode CE separated by the spacers SPACER located over the touch electrode TE.

Further, in examples where two or more spacers SPACER for insulating the emission layer EL and the cathode electrode CE disposed at a location corresponding to the touch electrode TE are disposed, an electric field path needed to form capacitance can become greater, and in turn, touch performance can be further improved.

Figure 13:
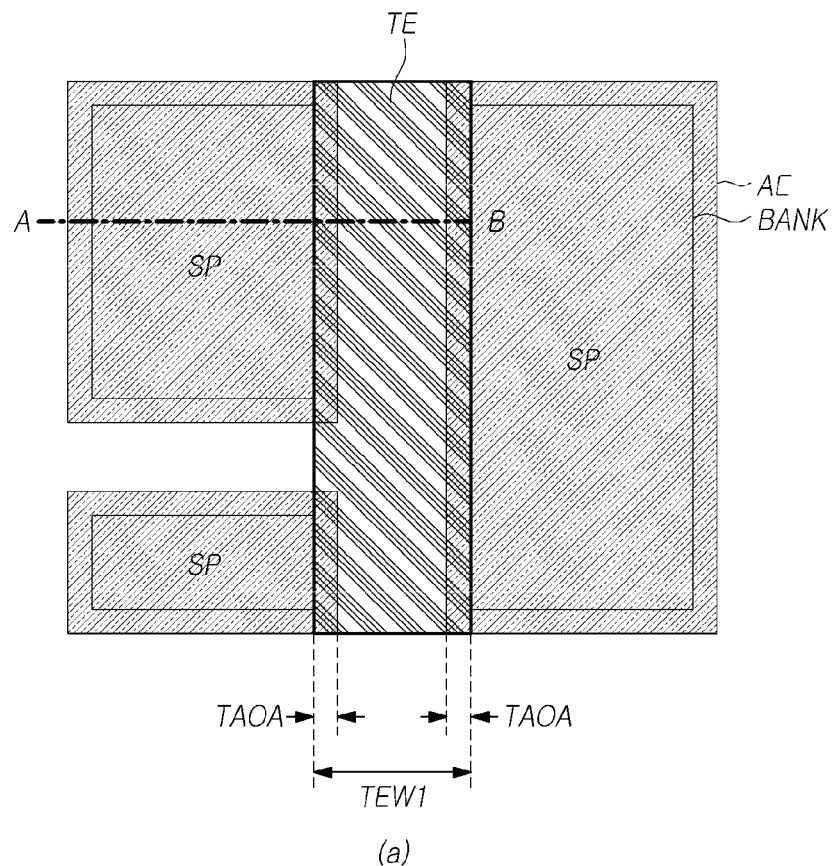
FIG. 13 is a plan view and a cross-sectional view illustrating an example where an overlap area between an anode electrode and a touch electrode is present in the display panel of the touch display device according to aspects of the present disclosure.
Figure 13:
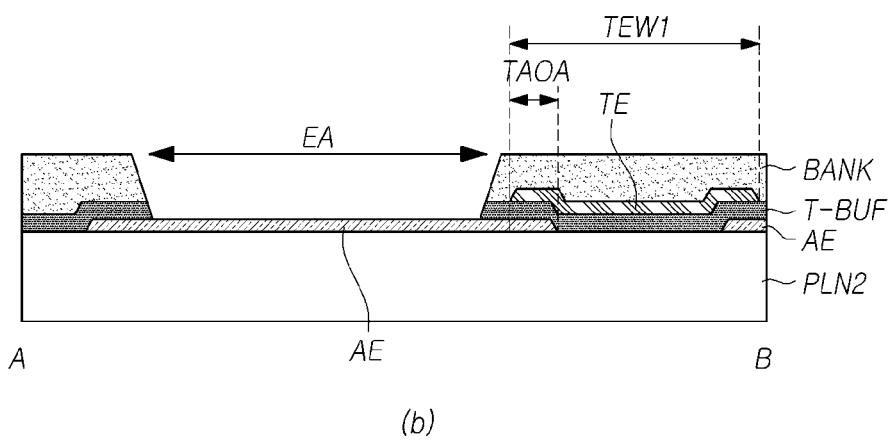
Figure 14:
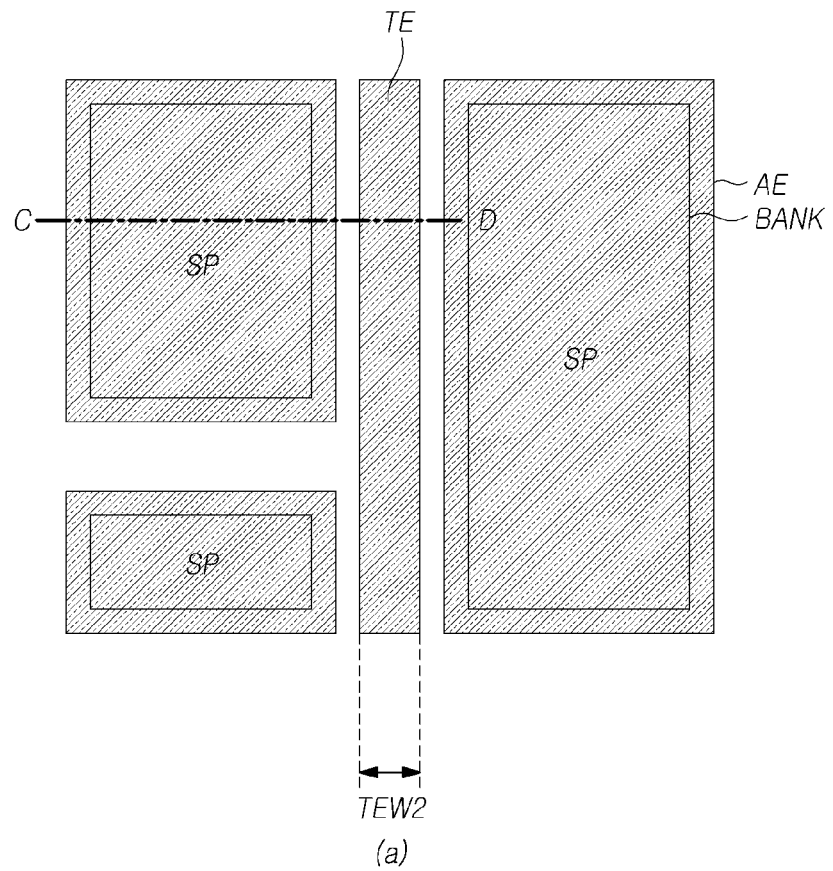
FIG. 14 is a plan view and a cross-sectional view illustrating an example where an overlap area between an anode electrode and a touch electrode is not present in the display panel of the touch display device according to aspects of the present disclosure.
Figure 14:
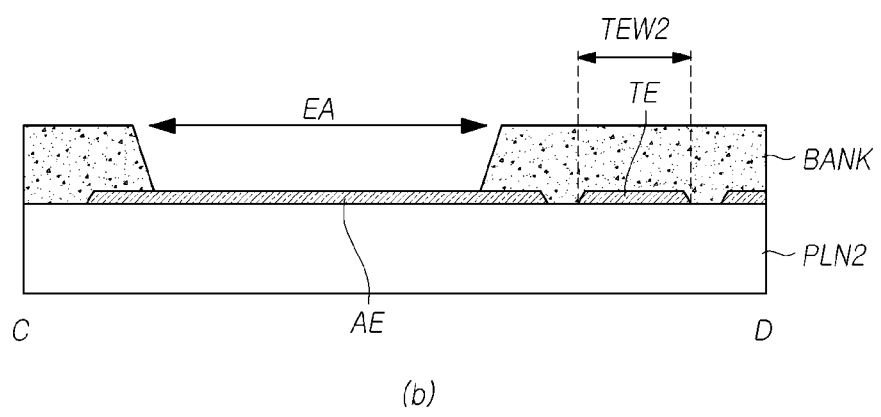

FIG. 13 is a plan view and a cross-sectional view illustrating an example where an overlap area between an anode electrode and a touch electrode is present in the display panel 110 of the touch display device 100 according to aspects of the present disclosure. FIG. 14 is a plan view and a cross-sectional view illustrating an example where an overlap area between an anode electrode and a touch electrode is not present in the display panel 110 of the touch display device 100 according to aspects of the present disclosure.

FIG. 13 (A) is the plan view of an area including three subpixels SP, and FIG. 13 (B) is the cross-sectional view taken along line A-B.

Referring to FIG. 13, in one or more embodiments, the display panel 110 of the touch display device 100 according to aspects of the present disclosure may include an overlap area TAOA overlapping an anode electrode AE disposed to cover a light emitting area EA and a touch electrode TE configured to sense a touch. The overlap area TAOA may be disposed in the non-light emitting area.

In these embodiments, the touch electrode TE and the anode electrode AE may be insulated from each other by a touch buffer layer T-BUF, and the touch electrode TE may be disposed on the anode electrode AE and overlap or cross the anode electrode AE by the width of the overlap area TAOA.

Thus, in the example where the touch electrode TE is formed to overlap or cross the anode electrode AE by the width of the overlap area TAOA, the width TEW1 of the touch electrode TE can increase by respective overlap areas TAOA formed on both edges of the touch electrode TE. As a result, touch performance of the touch display device 100 can be improved.

In contrast, in an example where the touch electrode TE and the anode electrode AE are formed in the same layer, an overlap area TAOA between the touch electrode TE and the anode electrode AE is not present, therefore, the area of the touch electrode TE become reduced.

FIG. 14 (A) is the plan view of a typical structure including three subpixels SP, and FIG. 14 (B) is the cross-sectional view taken along line C-D.

Referring to FIG. 14, in a typical touch display device, an anode electrode AE disposed to cover a light emitting area EA and a touch electrode TE for sensing a touch may be formed in the same layer.

Thus, in an example where the touch electrode TE is disposed in the same layer as the anode electrode AE, the area of the touch electrode TE cannot be extended to a location overlapping the anode electrode AE. As a result, the width TEW2 of the touch electrode TE can become smaller, and touch performance can be reduced.

As described above, the touch display device 100 according to aspects of embodiments of the present disclosure may have a structure in which the touch electrode TE is disposed to extend to a location overlapping a portion of the anode electrode AE while being disposed over the anode electrode AE. Thereby, the area of the touch electrode TE can be increased, and in turn, touch performance can be improved.

Figure 15:
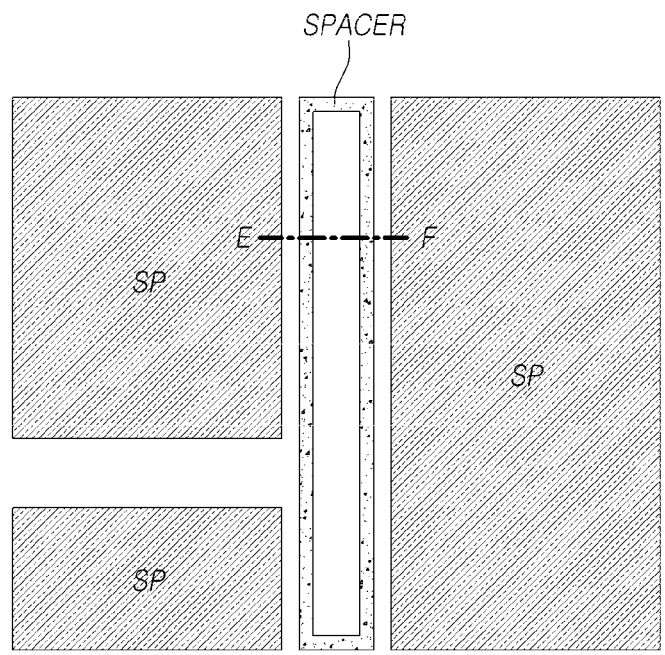
FIG. 15 is a plan view and a cross-sectional view illustrating an example where spacers configured to oppose each other are disposed over a touch electrode in the display panel of the touch display device according to aspects of the present disclosure.
Figure 15:
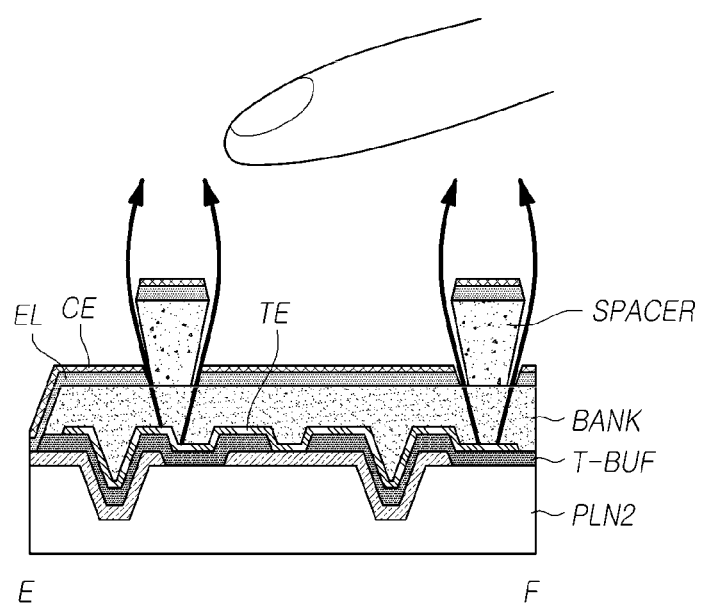
Figure 16:
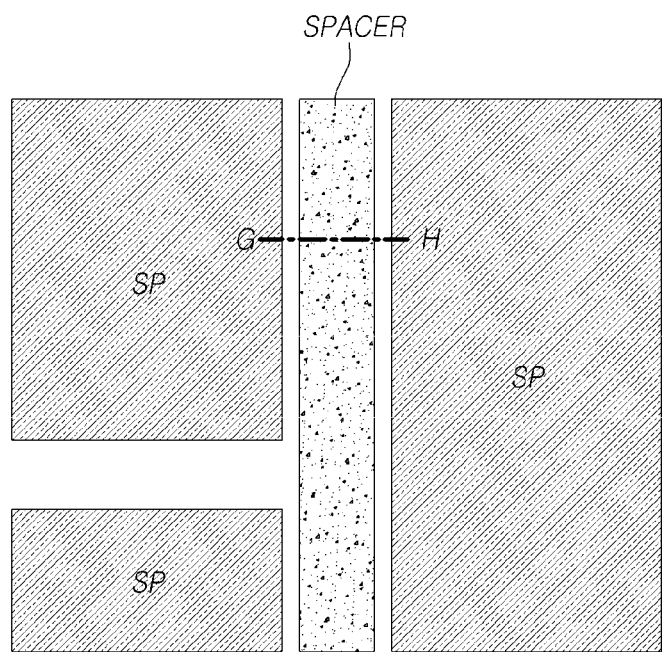
FIG. 16 is a plan view and a cross-sectional view illustrating an example where one spacer is disposed over a touch electrode in the display panel of the touch display device according to aspects of the present disclosure.
Figure 16:
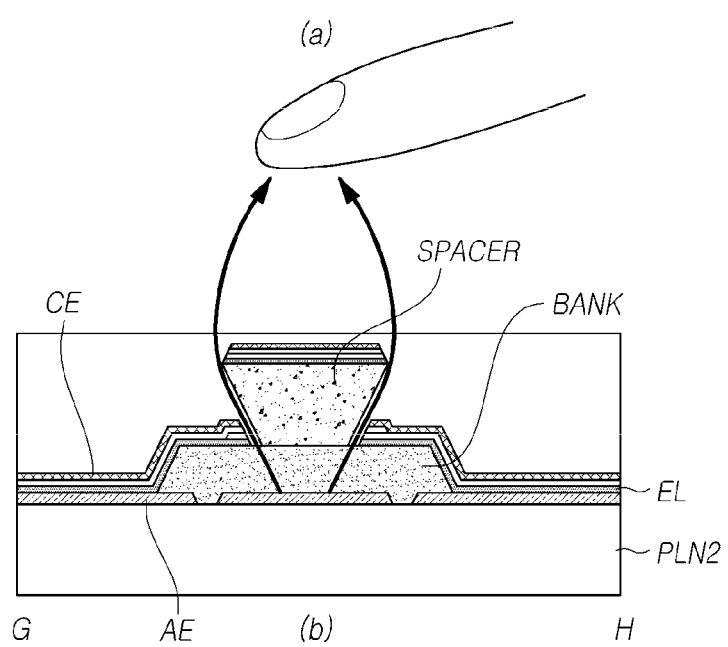

FIG. 15 is a plan view and a cross-sectional view illustrating an example where spacers SPACER configured to oppose each other are disposed over a touch electrode TE in the display panel 110 of the touch display device 100 according to aspects of the present disclosure. FIG. 16 is a plan view and a cross-sectional view illustrating an example where one spacer SPACER is disposed over a touch electrode TE in the display panel 110 of the touch display device 100 according to aspects of the present disclosure.

FIG. 15 (A) is the plan view of an area including three subpixels SP, and FIG. 13 (B) is the cross-sectional view taken along line E-F.

Referring to FIG. 15, in one or more embodiments, the display panel 110 of the touch display device 100 according to aspects of the present disclosure may include an overlap area TAOA overlapping an anode electrode AE disposed to cover a light emitting area EA and a touch electrode TE configured to sense a touch. The overlap area TAOA may be disposed in the non-light emitting area.

It should be noted here that when the emission layer EL and the cathode electrode CE extended to a non-light emitting area between light emitting areas EA overlap a touch electrode TE located under the emission layer EL and the cathode electrode CE, this implementation can interfere the formation of capacitance between a touch object such as a finger or a pen and the touch electrode TE, and thereby, touch performance can be reduced.

In order to prevent such an undesirable effect, spacers SPACER configured to oppose each other may be formed in an upper portion of the bank BANK overlapping the touch electrode TE.

In this manner, in examples where the emission layer EL and the cathode electrode CE located over the touch electrode TE are electrically disconnected by the spacers SPACER configured to oppose each other, an electric field path for enabling capacitance between the touch electrode TE and a touch object such as a finger or a pen to be effectively formed can be ensured by the application of the spacers SPACER.

In contrast, as shown in FIG. 16, in an example where one spacer SPACER is formed in an upper portion of the bank BANK overlapping a touch electrode TE, an electric field path for enabling capacitance between the touch electrode TE and a touch object such as a finger or a pen to be formed can become reduced compared with the examples of FIGS. 11, 12, 13, and 15.

FIG. 16 (A) is the plan view of a typical structure including three subpixels SP, and FIG. 16 (B) is the cross-sectional view taken along line G-H.

Referring to FIG. 16, in a typical touch display device, an emission layer EL forming a light emitting area EA and a cathode electrode CE may not electrically extend to an area overlapping a touch electrode TE, and one spacer SPACER may be formed in an upper portion of the bank BANK overlapping the touch electrode TE.

However, in the example where one spacer SPACER is formed in the upper portion of the bank BANK overlapping the touch electrode TE, when the cathode electrode CE is electrically separated, since an electric field path between the touch electrode TE and a touch object such as a finger or a pen is formed alongside edges of the spacer SPACER, an amount of capacitance formed across the touch electrode TE can be reduced, and thereby, touch performance can be reduced.

In contrast, as described above, in the touch display device 100 according to aspects of the present disclosure, as the spacers SPACER configured to oppose each other are formed over the touch electrode TE, and the emission layer EL and the cathode electrodes CE formed over the touch electrode TE are electrically disconnected by the spacers SPACER, the spacers SPACER configured to oppose each other can enable capacitance between the touch electrode TE and a touch object such as a finger or a pen to be effectively formed, and thereby, touch performance can be improved.

In one or more embodiments, in the touch display device 100 according to aspects of the present disclosure, since the touch electrode TE is formed on the anode electrode AE so that the touch electrode TE can have an overlap area TAOA with the anode electrode AE, a touch line TL for delivering a touch signal (e.g., a touch driving signal) to the touch electrode TE may include the same material as the anode electrode AE and be disposed in the same layer as the anode electrode AE.

Figure 17:
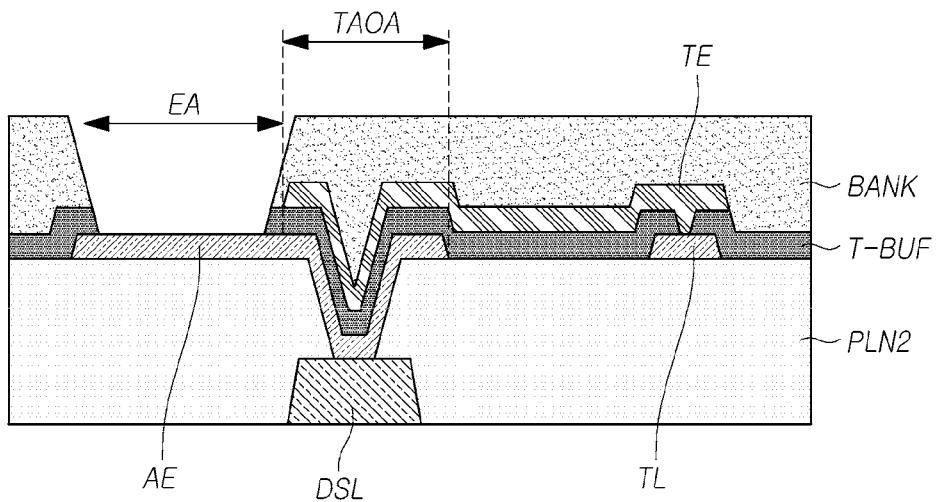
FIG. 17 is a cross-sectional view illustrating an example where a touch line is formed in the same layer as an anode electrode in the display panel of the touch display device according to aspects of the present disclosure.

FIG. 17 is a plan view and a cross-sectional view illustrating an example where a touch line TL is formed in the same layer as an anode electrode AE in the display panel 110 of the touch display device 100 according to aspects of the present disclosure.

Referring to FIG. 17, in one or more embodiments, the display panel 110 of the touch display device 100 according to aspects of the present disclosure may include a driving transistor DRT and a storage capacitor Cst disposed over a substrate SUB, and a light emitting element ED formed over the substrate SUB.

The structures of the driving transistor DRT and the storage capacitor Cst may be the same as those shown in FIG. 4, therefore, related discussions will be omitted for brevity sake.

A driving signal line DSL may be disposed to provide an electrical connection between the source electrode SE or drain electrode DE of the driving transistor DRT and the anode electrode AE of the light emitting element ED, and be disposed in a location overlapped with the anode electrode AE.

A second planarization layer PLN2 may be disposed on a first planarization layer PLN1 (e.g., the first planarization layer PLN1 in the figures discussed above) such that the second planarization layer PLN2 covers the driving signal line DSL.

The anode electrode AE may be disposed on the second planarization layer PLN2 in an area defined as a light emitting area EA of a corresponding subpixel SP. The anode electrode AE may be connected to the driving signal line DSL through an anode contact hole formed in the second planarization layer PLN2. Accordingly, the anode electrode AE may be electrically connected to the source electrode SE of the driving transistor DRT through the driving signal line DSL.

In one or more embodiments, a touch line TL may be disposed on the second planarization layer PLN2 in a non-light emitting area not overlapping the light emitting area EA of the subpixel SP. The touch line TL may be disposed in the same layer as the anode electrode AE and include the same material as the anode electrode AE.

Thus, in examples where the touch line TL is disposed in the same layer as the anode electrode AE and includes the same material as the anode electrode AE, since an additional touch jumping line TJL may not be needed, therefore, a corresponding manufacturing process can be reduced, and manufacturing defects can be reduced.

A touch buffer layer T-BUF may be disposed on the anode electrode AE and the touch line TL.

One or more touch electrodes TE may be disposed on the touch buffer layer T-BUF in a non-light emitting area not overlapping the light emitting area EA of the subpixel SP.

The touch electrode TE may be connected to the touch line TL through a touch contact hole of the touch buffer layer T-BUF.

In one or more embodiments, a portion of the touch electrode TE may extend from the non-light emitting area not overlapping the light emitting area EA of the subpixel SP to form an overlap area TAOA overlapping a portion of the anode electrode AE. That is, as the touch electrode TE is disposed to extend to a location overlapping a portion of the anode electrode AE while being disposed over the anode electrode AE, the area of the touch electrode TE can be expanded, and thereby, touch performance can be improved.

In one or more embodiments, in the touch display device 100 according to aspects of the present disclosure, a touch electrode TE may be formed under an anode electrode AE so that the touch electrode TE can have an overlap area TAOA with the anode electrode AE.

Figure 18:
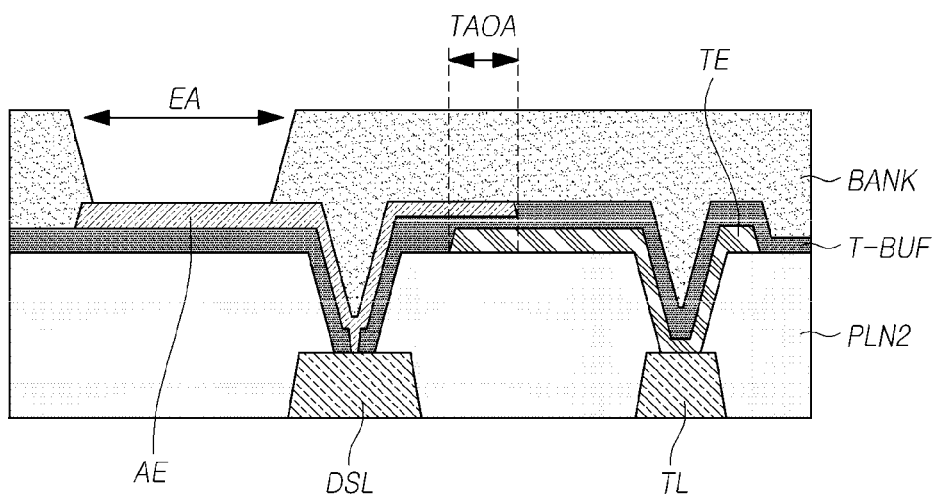
FIG. 18 is a cross-sectional view illustrating an example where a touch electrode is disposed under an anode electrode while forming an overlap area with the anode electrode in the display panel of the touch display device according to aspects of the present disclosure.

FIG. 18 is a cross-sectional view illustrating an example where a touch electrode TE is disposed under an anode electrode AE while having an overlap area with the anode electrode AE in the display panel 110 of the touch display device 100 according to aspects of the present disclosure.

Referring to FIG. 18, in one or more embodiments, the display panel 110 of the touch display device 100 according to aspects of the present disclosure may include a driving transistor DRT and a storage capacitor Cst disposed over a substrate SUB, and a light emitting element ED formed over the substrate SUB.

The structures of the driving transistor DRT and the storage capacitor Cst may be the same as those shown in FIG. 4, therefore, related discussions will be omitted for brevity sake.

A driving signal line DSL may be disposed to provide an electrical connection between the source electrode SE of the driving transistor DRT and the anode electrode AE of the light emitting element ED, and be disposed in a location overlapped with the anode electrode AE.

A driving signal line DSL for enabling a driving current to be supplied to the light emitting element ED and a touch line TL for delivering a touch signal (e.g., a touch driving signal) to a touch electrode TE may be disposed on a first planarization layer PLN1 (e.g., the first planarization layer PLN1 in the figures discussed above). The driving signal line DSL and the touch line TL may include the same material as the source electrode SE or drain electrode DE of the driving transistor DRT.

One or more touch electrodes TE may be disposed on a second planarization layer PLN2 in a non-light emitting area not overlapping the light emitting area EA of a corresponding subpixel SP.

A touch buffer layer T-BUF may be disposed on the touch electrode TE.

The anode electrode AE may be disposed on the touch buffer layer T-BUF in an area defined as the light emitting area EA of the subpixel SP.

In one or more embodiments, the anode electrode AE may extend from the light emitting area EA to the non-light emitting area to form an overlap area TAOA overlapping the touch electrode TE while being located over the touch electrode TE.

The anode electrode AE may be connected to the driving signal line DSL through an anode contact hole passing through the touch buffer layer T-BUF and the second planarization layer PLN2. Accordingly, the anode electrode AE may be electrically connected to the source electrode SE of the driving transistor DRT through the driving signal line DSL.

In this manner, as a portion of the anode electrode AE extending from the light emitting area EA forms an overlap area TAOA overlapping a portion of the touch electrode TE in the non-light emitting area, the area of the touch electrode TE can be extended, and thereby, touch performance can be improved.

In one or more embodiments, in the touch display device 100 according to aspects of the present disclosure, the touch electrode TE may be formed under the anode electrode AE so that the touch electrode TE can have an overlap area TAOA with the anode electrode AE. In these embodiments, a touch line TL for delivering a touch signal (e.g., a touch driving signal) to the touch electrode TE may be disposed on the touch electrode TE.

Figure 19:
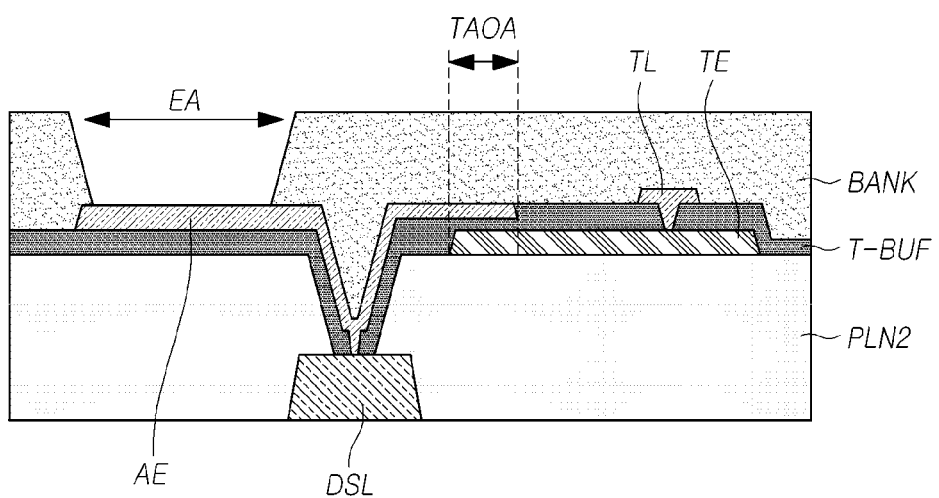
FIG. 19 is a cross-sectional view illustrating an example where a touch line is disposed on a touch electrode in the display panel of the touch display device according to aspects of the present disclosure.

FIG. 19 is a cross-sectional view illustrating an example where a touch line TL is disposed on a touch electrode TE in the display panel 110 of the touch display device 100 according to aspects of the present disclosure.

Referring to FIG. 19, in one or more embodiments, the display panel 110 of the touch display device 100 according to aspects of the present disclosure may include a driving transistor DRT and a storage capacitor Cst disposed over a substrate SUB, and a light emitting element ED formed over the substrate SUB.

The structures of the driving transistor DRT and the storage capacitor Cst may be the same as those shown in FIG. 4, therefore, related discussions will be omitted for brevity sake.

A driving signal line DSL may be disposed on a first planarization layer PLN1 (e.g., the first planarization layer PLN1 in the figures discussed above) to provide an electrical connection between the source electrode SE or drain electrode DE of the driving transistor DRT and the anode electrode AE of the light emitting element ED, and be disposed in a location overlapped with the anode electrode AE.

A second planarization layer PLN2 may be disposed on the first planarization layer PLN1 such that the second planarization layer PLN2 covers the driving signal line DSL.

One or more touch electrodes TE may be disposed on the second planarization layer PLN2 in a non-light emitting area not overlapping the light emitting area EA of a corresponding subpixel SP.

A touch buffer layer T-BUF may be disposed on the touch electrode TE.

The anode electrode AE may be disposed on the touch buffer layer T-BUF in an area defined as the light emitting area EA of the subpixel SP.

In one or more embodiments, the anode electrode AE may extend from the light emitting area EA to the non-light emitting area to form an overlap area TAOA overlapping the touch electrode TE while being located over the touch electrode TE.

The anode electrode AE may be connected to the driving signal line DSL through an anode contact hole passing through the touch buffer layer T-BUF and the second planarization layer PLN2. Accordingly, the anode electrode AE may be electrically connected to the source electrode SE of the driving transistor DRT through the driving signal line DSL.

In one or more embodiments, a touch line TL may be disposed on the second planarization layer PLN2 in a non-light emitting area not overlapping the light emitting area EA of the subpixel SP. The touch line TL may be disposed in the same layer as the anode electrode AE and include the same material as the anode electrode AE.

Thus, in examples where the touch line TL is disposed in the same layer as the anode electrode AE and includes the same material as the anode electrode AE, since an additional touch jumping line TJL may not be needed, therefore, a corresponding manufacturing process can be reduced, and manufacturing defects can be reduced.

The touch electrode TE may be connected to the touch line TL through a touch contact hole of the touch buffer layer T-BUF.

In this manner, as a portion of the anode electrode AE extending from the light emitting area EA forms an overlap area TAOA overlapping a portion of the touch electrode TE in the non-light emitting area, the area of the touch electrode TE can be extended, and thereby, touch performance can be improved.

The embodiments described above will be briefly described as follows.

According to aspects of the present disclosure, the display panel 110 can be provided that includes: a transistor disposed over a substrate SUB; a first planarization layer PLN1 and a second planarization layer PLN2 disposed over the transistor; an anode electrode AE disposed in a light emitting area EA on the second planarization layer PLN2 and electrically connected to the transistor through an anode contact hole A-CNT; a touch buffer layer T-BUF disposed to cover the anode electrode AE; a touch electrode TE including an overlap area TAOA overlapping a portion of the anode electrode AE in a non-light emitting area on the touch buffer layer T-BUF; a touch line TL disposed under the touch electrode TE and electrically connected to the touch electrode TE through a touch contact hole T-CNT; a bank BANK covering the touch electrode TE and including an opening in which the light emitting area EA is placed; and an emission layer EL and a cathode electrode CE sequentially disposed on the anode electrode AE.

The touch line TL may be disposed on the first planarization layer PLN1.

The touch line TL may include the same material as the source electrode SE or drain electrode DE of the transistor.

The display panel 110 may be further include a touch jumping line TJLd that is disposed at a location spaced apart from the anode electrode AE in the non-light emitting area on the second planarization layer PLN2, and electrically interconnects the touch electrode TE and the touch line TL.

The touch jumping line TJL may include the same material as the anode electrode AE.

The overlap area TAOA may not overlap the light emitting area EA.

The display panel 110 may further include spacers SPACER, which are configured to oppose each other, that are disposed in a non-light emitting area on the bank, and that electrically separate the cathode electrode CE from the light emitting area EA.

The spacers SPACER configured to oppose each other may have a structure surrounding, and upwardly extending in, an area where the touch electrode TE is disposed.

According to aspects of the present disclosure, the display device 100 can be provided that includes: the display panel 110 including a transistor disposed over a substrate SUB, a first planarization layer PLN1 and a second planarization layer PLN2 disposed over the transistor, an anode electrode AE disposed in a light emitting area EA on the second planarization layer PLN2 and electrically connected to the transistor through an anode contact hole A-CNT, a touch buffer layer T-BUF disposed to cover the anode electrode AE, a touch electrode TE including an overlap area TAOA overlapping a portion of the anode electrode AE in a non-light emitting area on the touch buffer layer T-BUF, a touch line TL disposed under the touch electrode TE and electrically connected to the touch electrode TE through a touch contact hole T-CNT, a bank BANK covering the touch electrode TE and including an opening in which the light emitting area EA is placed, and an emission layer EL and a cathode electrode CE sequentially disposed on the anode electrode AE; and a touch circuit 150 configured to supply a touch driving signal to the touch electrode TE through the touch line TL, and sense a touch based on a touch sensing signal obtained through the touch electrode TE to which the touch driving signal is applied.

According to aspects of the present disclosure, the display panel 110 can be provided that includes: a transistor disposed over a substrate SUB; a first planarization layer PLN1 and a second planarization layer PLN2 disposed over the transistor; a touch electrode TE disposed in a non-light emitting area on the second planarization layer PLN2; a touch buffer layer T-BUF disposed to cover the touch electrode TE; an anode electrode AE including an overlap area TAOA overlapping a portion of the touch electrode TE in a non-light emitting area on the touch buffer layer T-BUF, and electrically connected to the transistor; a touch line TL electrically connected to the touch electrode TE through a touch contact hole T-CNT; a bank BANK covering the anode electrode AE and including an opening in which the light emitting area EA is placed; and an emission layer EL and a cathode electrode CE sequentially disposed on the anode electrode AE.

The touch line TL may be disposed on the first planarization layer PLN1.

The touch line TL may include the same material as the source electrode SE or drain electrode DE of the transistor.

The touch line TL may be disposed on the touch buffer layer T-BUF.

The touch line TL may include the same material as the anode electrode AE.

The overlap area TAOA may not overlap the light emitting area EA.

The display panel 110 may further include spacers SPACER, which are configured to oppose each other, that are disposed in a non-light emitting area on the bank, and that electrically separate the cathode electrode CE from the light emitting area EA.

The spacers SPACER configured to oppose each other may have a structure surrounding, and upwardly extending in, an area where the touch electrode TE is disposed.

According to aspects of the present disclosure, the display device 100 can be provided that includes: the display panel 110 including a transistor disposed over a substrate SUB, a first planarization layer PLN1 and a second planarization layer PLN2 disposed over the transistor, a touch electrode TE disposed in a non-light emitting area on the second planarization layer PLN2, a touch buffer layer T-BUF disposed to cover the touch electrode TE, an anode electrode AE including an overlap area TAOA overlapping a portion of the touch electrode TE in a non-light emitting area on the touch buffer layer T-BUF, and electrically connected to the transistor, a touch line TL electrically connected to the touch electrode TE through a touch contact hole T-CNT, a bank BANK covering the anode electrode AE and including an opening in which the light emitting area EA is placed, and an emission layer EL and a cathode electrode CE sequentially disposed on the anode electrode AE; and a touch circuit 150 configured to supply a touch driving signal to the touch electrode TE through the touch line TL, and sense a touch based on a touch sensing signal obtained through the touch electrode TE to which the touch driving signal is applied.

The above description has been presented to enable any person skilled in the art to make, use and practice the technical features of the present invention, and has been provided in the context of a particular application and its requirements as examples. Various modifications, additions and substitutions to the described embodiments will be readily apparent to those skilled in the art, and the principles described herein may be applied to other embodiments and applications without departing from the scope of the present invention. The above description and the accompanying drawings provide examples of the technical features of the present invention for illustrative purposes only. That is, the disclosed embodiments are intended to illustrate the scope of the technical features of the present invention.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display panel, comprising:
 a transistor disposed over a substrate;
 a first planarization layer and a second planarization layer disposed over the transistor;
 an anode electrode disposed on the second planarization layer and electrically connected to the transistor through an anode contact hole;
 an emission layer and a cathode electrode disposed on the anode electrode;

a touch buffer layer disposed to cover the anode electrode;
a touch electrode including an overlap area overlapping a portion of the anode electrode in a non-light emitting area on the touch buffer layer; and
a touch line disposed under the touch electrode and electrically connected to the touch electrode through a touch contact hole,
wherein the touch buffer layer and the touch electrode are between the anode electrode and the cathode electrode.

2. The display panel of claim 1, wherein the touch line is disposed on the first planarization layer.

3. The display panel of claim 2, wherein the touch line comprises a same material as a source electrode or a drain electrode of the transistor.

4. The display panel of claim 2, further comprising: a touch jumping line that is disposed at a location spaced apart from the anode electrode in the non-light emitting area on the second planarization layer, and electrically interconnects the touch electrode and the touch line.

5. The display panel of claim 4, wherein the touch jumping line comprises a same material as the anode electrode.

6. The display panel of claim 1, wherein the overlap area does not overlap the light emitting area.

7. The display panel of claim 1, further comprising:
a bank covering the touch electrode and including an opening in which the light emitting area is placed.

8. The display panel of claim 7, further comprising spacers configured to oppose each other that are disposed in the non-light emitting area on the bank, and that electrically separate the cathode electrode from the light emitting area.

9. The display panel of claim 8, wherein the spacers configured to oppose each other have a structure surrounding, and upwardly extending in, an area where the touch electrode is disposed.

10. A touch display device, comprising:
a display panel comprising a transistor disposed over a substrate, a first planarization layer and a second planarization layer disposed over the transistor, an anode electrode disposed on the second planarization layer and electrically connected to the transistor through an anode contact hole, an emission layer and a cathode electrode disposed on the anode electrode, a touch buffer layer disposed to cover the anode electrode, a touch electrode including an overlap area overlapping a portion of the anode electrode in a non-light emitting area on the touch buffer layer, and a touch line disposed under the touch electrode and electrically connected to the touch electrode through a touch contact hole; and
a touch circuit configured to supply a touch driving signal to the touch electrode through the touch line, and sense a touch based on a touch sensing signal obtained through the touch electrode,
wherein the touch buffer layer and the touch electrode are between the anode electrode and the cathode electrode.

11. A display panel, comprising:
a transistor disposed over a substrate;
a first planarization layer and a second planarization layer disposed over the transistor;
a touch electrode disposed in a non-light emitting area on the second planarization layer;
a touch buffer layer disposed to cover the touch electrode;
an anode electrode including an overlap area overlapping a portion of the touch electrode in a non-light emitting area on the touch buffer layer, and electrically connected to the transistor;
an emission layer and a cathode electrode disposed on the anode electrode: and
a touch line electrically connected to the touch electrode through a touch contact hole,
wherein the touch buffer layer is between the touch electrode and the anode electrode. and
wherein the anode electrode is electrically insulated from the touch electrode.

12. The display panel of claim 11, wherein the touch line is disposed on the first planarization layer.

13. The display panel of claim 12, wherein the touch line comprises a same material as a source electrode or a drain electrode of the transistor.

14. The display panel of claim 11, wherein the touch line is disposed on the touch buffer layer.

15. The display panel of claim 14, wherein the touch line comprises a same material as the anode electrode.

16. The display panel of claim 11, wherein the overlap area does not overlap the light emitting area.

17. The display panel of claim 11, further comprising:
a bank covering the anode electrode and including an opening in which a light emitting area is placed.

18. The display panel of claim 17, further comprising: spacers configured to oppose each other that are disposed in the non-light emitting area on the bank, and that electrically separate the cathode electrode from the light emitting area.

19. The display panel of claim 18, wherein the spacers configured to oppose each other have a structure surrounding, and upwardly extending in, an area where the touch electrode is disposed.

* * * * *

UNITED STATES PATENT AND TRADEMARK OFFICE
CERTIFICATE OF CORRECTION

PATENT NO. : 12,153,752 B2
APPLICATION NO. : 18/454604
DATED : November 26, 2024
INVENTOR(S) : Jinseong Kim et al.

Page 1 of 1

It is certified that error appears in the above-identified patent and that said Letters Patent is hereby corrected as shown below:

In the Claims

Column 24, Claim 11, Line 19:
"anode electrode: and" should read: --anode electrode; and--.

Column 24, Claim 11, Line 23:
"anode electrode. and" should read: --anode electrode, and--.

Signed and Sealed this
Fourth Day of February, 2025

Coke Morgan Stewart
*Acting Director of the United States Patent and Trademark Office*